United States Patent
Isobe et al.

(10) Patent No.: US 7,883,641 B2
(45) Date of Patent: Feb. 8, 2011

(54) METAL OXIDE PHOSPHOR MICROPARTICLE AND PROCESS FOR PRODUCING THE SAME; UTILIZING THE SAME, DISPERSION LIQUID, FLUORESCENCE CONVERSION MEMBRANE, METHOD OF SEPARATING METAL OXIDE PHOSPHOR MICROPARTICLE, FLUORESCENT LIQUID, FLUORESCENT PASTE, PHOSPHOR AND PROCESS FOR PRODUCING THE SAME; AND FLUORESCENCE CONVERTER

(75) Inventors: Tetsuhiko Isobe, Yokohama (JP); Ryo Kasuya, Yokohama (JP); Aya Kawano, Yokohama (JP); Hitoshi Kuma, Sodegaura (JP); Junichi Katano, Sodegaura (JP)

(73) Assignees: Keio University, Tokyo (JP); Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 12/546,162

(22) Filed: Aug. 24, 2009

(65) Prior Publication Data
US 2010/0047561 A1 Feb. 25, 2010

Related U.S. Application Data

(63) Continuation of application No. 10/587,631, filed as application No. PCT/JP2005/000976 on Jan. 26, 2005, now abandoned.

(30) Foreign Application Priority Data
Jan. 29, 2004 (JP) ............................... 2004-021488

(51) Int. Cl.
*C09K 11/08* (2006.01)

(52) U.S. Cl. ........................ 252/301.36; 252/301.4 R; 252/301.4 P; 252/301.6 R; 252/301.6 P; 252/301.4 F; 252/301.6 F; 977/783; 977/786

(58) Field of Classification Search ............ 252/301.36, 252/301.4 R, 301.4 P, 301.6 R, 301.6 P, 301.4 F; 977/783, 786
See application file for complete search history.

(56) References Cited

U.S. PATENT DOCUMENTS 5,985,173 A  11/1999 Gray et al.

(Continued)

FOREIGN PATENT DOCUMENTS

JP    9 127686    5/1997

(Continued)

OTHER PUBLICATIONS

Masashi Inoue, et al., "Synthesis of Rare-Earth Gallium Garnets by the Glycothermal Method", J. Am. Ceram. Soc., vol. 81, No. 5, XP-002514266, May 1998, pp. 1173-1183.

(Continued)

*Primary Examiner*—C. Melissa Koslow
(74) *Attorney, Agent, or Firm*—Oblon, Spivak, McClelland, Maier & Neustadt, L.L.P.

(57) ABSTRACT

In accordance with the present invention, there are provided metal oxide-based phosphor microfine particles comprising a matrix crystal made of a metal oxide and a metal element doped as an emission center into the matrix crystal, wherein the microfine particles are provided with an organic group coordinated to a surface thereof, have a small particle size as well as a high affinity to and a high dispersibility in light-transmittable resins, and are inhibited from scattering light emitted from a light source; a process for producing the metal oxide-based phosphor microfine particles; a dispersion of the metal oxide-based phosphor microfine particles; a fluorescent conversion film; a method of separating the metal oxide-based phosphor microfine particles; a fluorescent liquid; a fluorescent paste; a phosphor; a process for producing the phosphor; and a fluorescent converter.

3 Claims, 12 Drawing Sheets

U.S. PATENT DOCUMENTS

| | | | |
|---|---|---|---|
| 6,093,492 | A | 7/2000 | Bredol et al. |
| 6,576,155 | B1 | 6/2003 | Barbera-Guillem |
| 6,783,699 | B2 | 8/2004 | Li et al. |
| 7,303,697 | B2 | 12/2007 | Isobe |
| 7,393,618 | B2 | 7/2008 | Ioku et al. |
| 7,410,810 | B2 | 8/2008 | Bohmann et al. |
| 2003/0032192 | A1 * | 2/2003 | Haubold et al. ............... 436/56 |

FOREIGN PATENT DOCUMENTS

| | | |
|---|---|---|
| JP | 10 168442 | 6/1998 |
| JP | 11 181419 | 7/1999 |
| JP | 2000 204368 | 7/2000 |
| JP | 2002 121549 | 4/2002 |
| JP | 2002-156498 | 5/2002 |
| WO | 03/040024 | 5/2003 |

OTHER PUBLICATIONS

Masashi Inoue, et al., "Synthesis of Yttrium Aluminum Garnet by the Glycothermal Method", Journal of the American Ceremic Society, vol. 74, No. 6, Jun. 1, 1991, XP-000236484, pp. 1452-1454.

* cited by examiner

METAL OXIDE PHOSPHOR MICROPARTICLE AND PROCESS FOR PRODUCING THE SAME; UTILIZING THE SAME, DISPERSION LIQUID, FLUORESCENCE CONVERSION MEMBRANE, METHOD OF SEPARATING METAL OXIDE PHOSPHOR MICROPARTICLE, FLUORESCENT LIQUID, FLUORESCENT PASTE, PHOSPHOR AND PROCESS FOR PRODUCING THE SAME; AND FLUORESCENCE CONVERTER

CROSS REFERENCE TO RELATED APPLICATIONS

This application is a continuation of U.S. patent application Ser. No. 10/587,631, filed Jul. 27, 2006 now abandoned which is the U.S. national stage of International Application No. PCT/JP05/00976, filed Jan. 26, 2005, the disclosures of which are incorporated herein by reference in their entireties. This application claims priority to Japanese Patent Application No. 2004-021488, filed Jan. 29, 2004, the disclosure of which is incorporated herein by reference in its entirety.

TECHNICAL FIELD

The present invention relates to metal oxide-based phosphor microfine particles, and more particularly to metal oxide-based phosphor microfine particles having a small particle size as well as a high affinity to and a high dispersibility in light-transmittable resins which are inhibited from scattering a light emitted from a light source, a process for producing the metal oxide-based phosphor microfine particles, dispersions of the metal oxide-based phosphor microfine particles, fluorescent conversion films, a method of separating the metal oxide-based phosphor microfine particles, fluorescent liquids, fluorescent pastes, phosphors, a process for producing the phosphors, and fluorescent converters.

BACKGROUND ART

Fluorescent conversion films using a phosphor or fluorescent material which are capable of converting light emitted from a light source into light having a different wavelength have been extensively used in various application fields such as electronic displays. For example, there are disclosed organic electroluminescent devices having an organic electroluminescent material portion emitting blue light or bluish green light, and a phosphor portion absorbing the light emitted from the light-emitting layer and emitting a visible fluorescence having at least one color ranging from bluish green to red (e.g., refer to Japanese Patent Application Laid-open No. 152897/1991). Also, there are disclosed red color fluorescent conversion films obtained by dispersing a rhodium-based fluorescent pigment and a fluorescent pigment having an absorption band in a blue light range and being capable of inducing transfer or reabsorption of energy into the rhodium-based fluorescent pigment, in a light-transmitting medium (e.g., refer to Japanese Patent Application Laid-open No. 286033/1996). In these fluorescent conversion films, there have been used organic fluorescent pigments having a cycloalkyl group and/or a heterocyclic ring as a steric hindrance group, for example, as disclosed in Japanese Patent Application Laid-open No. 44824/2000.

However, these conventional techniques have the following problems.

(1) In order to enhance a color purity of light emitted from devices, light emitted from an excitation light source must be converted into light having the other wavelength by a fluorescent conversion film at a high efficiency. If the light emitted from the excitation light source is transmitted through the film without conversion, the color purity thereof tends to be lowered. For the purposes of enhancing a conversion efficiency of the fluorescent conversion film and increasing an intensity (fluorescence intensity) of the converted light, it is required to allow the film to sufficiently absorb the light emitted from the excitation light source. However, if the concentration of organic fluorescent pigments contained in the fluorescent conversion film is increased for allowing the film to sufficiently absorb the light, undesired association between the organic fluorescent pigments tends to occur in the film, so that energy absorbed from the light source is transferred to the adjacent pigments. As a result, a so-called concentration quenching phenomenon is inevitably caused, thereby failing to attain a high fluorescence quantum yield.

(2) As the light-transmitting medium, reaction-curable resins such as photocurable resins and heat-curable resins have been mainly used in view of achieving improvements in heat resistance or productivity of the fluorescent conversion films. In this case, there tends to arise such a problem that reactive components contained in the resins are reacted with the organic fluorescent pigments, resulting in decomposition of the pigments or change in structure of the films and, therefore, further deterioration in fluorescent properties thereof.

The above problem is more specifically explained below on the basis of experiments. In FIG. 16, there is shown the relationship between an absorbance and a fluorescence quantum yield of the fluorescent conversion film when varying a concentration of pigments contained in the film wherein the circle mark (○) indicates the fluorescent conversion film obtained by dispersing rhodamine 6G as an organic fluorescent pigment in a benzoguanamine resin; the triangle mark (△) indicates the fluorescent conversion film obtained by dispersing coumarin 6 as an organic fluorescent pigment in a benzoguanamine resin; and the solid triangle mark (▲) indicates the fluorescent conversion film obtained by dispersing coumarin 6 as an organic fluorescent pigment in a photocurable resin. Meanwhile, the rhodamine 6G-dispersed film was irradiated with light from a light source having a peak at 534 nm, whereas the coumarin 6-dispersed films were irradiated with light from a light source having a peak at 456 nm. In FIG. 16, the abscissa axis represents an absorbance at the wavelength, whereas the ordinate axis represents a fluorescence quantum yield.

As apparently shown in FIG. 16, when the concentration of the pigments in the fluorescent conversion film is low, the fluorescence quantum yield of the film is as low as less than 50% in the range where the absorbance to the excited light is more than 1 even when using such pigments having a fluorescence quantum yield as high as 80% or more. In particular, in the case where the pigments are dispersed in a photocurable resin as a reactive resin, it is recognized that the fluorescence quantum yield of the film is as low as about 30%.

To solve the above problems encountered upon using the organic fluorescent pigments, there are disclosed techniques using inorganic phosphors in place of the organic fluorescent pigments (e.g., refer to Japanese Patent Application Laid-open Nos. 199781/1999 and 181419/1999 and U.S. Pat. No. 6,608,439).

In Japanese Patent Application Laid-open No. 199781/1999, cerium-activated yttrium/aluminum/garnet-based phosphors (so-called YAG:Ce phosphors) are used as the inorganic phosphors, and the phosphors are dispersed in a thermoplastic resin sheet to form a fluorescent conversion film. In the above Japanese Patent Application, since a baked YAG:Ce molded product is pulverized to produce phosphor microfine particles used in the fluorescent conversion film, the resultant microfine particles have a particle size in the order of a micron meter. For this reason, in order to allow the fluorescent conversion film to fully absorb light emitted from an excitation light source without scattering the light, it is required to increase a thickness of the resin sheet, for example, up to a thickness as large as 120 μm, and disperse the microfine particles therein at a low concentration. As a result, it is difficult to apply such a resin sheet to a fluorescent conversion film for organic electroluminescent devices.

In Japanese Patent Application Laid-open No. 181419/1999, there is disclosed the process for producing a metal oxide-based phosphor by reacting at least one compound selected from the group consisting of carbonates, nitrates, hydroxides, sulfates, phosphates, borates, silicates, aluminates, carboxylates, halides and alkoxides of a metal element constituting a matrix and an activator of the phosphor with an oxy-carboxylic acid or a polyamino chelating agent to obtain a metal complex, polymerizing the metal complex with a polyol in a solvent to produce a complex polymer, and baking the complex polymer. However, in this method, since the baking is performed at a temperature as high as 800° C. or more, organic components contained in the reaction product tend to be thermally decomposed, so that the particles undergo secondary agglomeration. As a result, the particle size of the obtained phosphor particles is as large as about 100 nm and, therefore, still unsatisfactory. Further, in the method, for the same reason as described above, there tends to arise such a problem that the obtained phosphor particles have a poor dispersibility in organic solvents or resins.

In the literature "APPLIED PHYSICS LETTERS", Vol. 80, No. 19, pp. 3608 to 3610 (2002), fine particles obtained by sol-gel method are baked at a temperature as high as 800° C. or more, thereby producing a YAG:Ce phosphor having a particle size of about 35 nm. However, similarly to the process described in Japanese Patent Application Laid-open No. 181419/1999, since the obtained particles contains no organic components, there tends to arise such a problem that the obtained particles have a poor dispersibility in organic solvents or resins.

In U.S. Pat. No. 6,608,439, a film obtained by dispersing a nano-crystal of a Group II to VI semiconductor such as cadmium selenide (CdSe) in a resin is used as a fluorescent, conversion film. However, in general, the metal chalcogenide tends to be deteriorated in durability such as water resistance, chemical resistance and heat resistance.

DISCLOSURE OF THE INVENTION

Problems to be Solved by the Invention

The present invention has been made in view of the above problems. An object of the present invention is to provide metal oxide-based phosphor microfine particles which have a small particle size as well as a high affinity to and a high dispersibility in light-transmittable medium, are inhibited from scattering light emitted from a light source, and exhibit excellent water resistance, chemical resistance and heat resistance; a process for producing the metal oxide-based phosphor microfine particles; a dispersion of the metal oxide-based phosphor microfine particles; a fluorescent conversion film; a method of separating the metal oxide-based phosphor microfine particles; a fluorescent liquid; a fluorescent paste; a phosphor; a process for producing the phosphor; and a fluorescent converter.

Means for Solving Problems

As a result of intensive and extensive researches, the inventors have found that the above object can be achieved by using, as a fluorescent material, metal oxide-based phosphor microfine particles comprising a matrix crystal made of a metal oxide, a metal element doped as an emission center into the matrix crystal, and an organic group coordinated to a surface of the microfine particles. The present invention has been accomplished on the basis of the above finding.

Thus, the present invention provides:

Metal oxide-based phosphor microfine particles comprising a matrix crystal made of a metal oxide and a metal element doped as an emission center into the matrix crystal, wherein said microfine particles are provided with an organic group coordinated to a surface thereof;

A dispersion of metal oxide-based phosphor microfine particles comprising:

(a) a dispersing medium containing an organic compound having one or more functional groups bonded to a terminal end or a side chain thereof; and (b) the metal oxide-based phosphor microfine particles comprising a matrix crystal made of a metal oxide and a metal element doped as an emission center into the matrix crystal, wherein said microfine particles are provided with an organic group coordinated to a surface thereof which is formed by dissociating at least one of the functional groups from the organic compound;

A fluorescent conversion film comprising a light-transmittable resin and the metal oxide-based phosphor microfine particles as defined above which are dispersed in the light-transmittable resin;

A process for producing metal oxide-based phosphor microfine particles, comprising:

dissolving or dispersing a compound of a metal element forming a matrix made of a metal oxide and a compound of a metal element as an emission center in a dispersing medium containing an organic compound having one or more functional groups bonded to a terminal end or a side chain thereof to prepare a solution;

enclosing the solution in a pressure container; and heating the solution at a temperature not lower than a boiling point of the organic compound;

A method of separating metal oxide-based phosphor microfine particles comprising the step of subjecting a mixture of the metal oxide-based phosphor microfine particles and a solvent to centrifugal separation, filtration, natural sedimentation or combination thereof for classifying the microfine particles to separate transparent metal oxide-based phosphor microfine particles containing the solvent from the mixture;

A transparent fluorescent liquid comprising a solvent and 10% by weight or more of the metal oxide-based phosphor microfine particles as defined above, wherein light emitted from the metal oxide-based phosphor microfine particles which has a wavelength attributed to the metal oxide contained therein is transmitted through the fluorescent liquid at a transmittance of 50% or more in terms of an optical path length of 1 cm;

A transparent fluorescent paste comprising a solvent and 50% by weight or more of the metal oxide-based phosphor microfine particles as defined above, wherein light emitted from the metal oxide-based phosphor microfine particles which has a wavelength attributed to the metal oxide contained therein is transmitted through the fluorescent paste at a transmittance of 50% or more in terms of an optical path length of 150 μm;

A phosphor produced by baking the fluorescent liquid as defined above at a temperature of 500° C. or lower;

A process for producing a phosphor comprising the step of baking the fluorescent liquid or the fluorescent paste as defined above at a temperature of 500° C. or lower; and A fluorescent converter comprising the phosphor as defined above solely, or a product obtained by adding a resin or a solvent to the phosphor and solidifying the obtained mixture, and a fluorescent converter obtained by dispersing the phosphor in a resin or a solvent.

EFFECT OF THE INVENTION

The metal oxide-based phosphor microfine particles of the present invention have a small particle size as well as a high affinity to and a high dispersibility in light-transmittable resins, and exhibit excellent water resistance, chemical resistance and heat resistance. Therefore, a fluorescent conversion film, a fluorescent liquid, a fluorescent paste, a phosphor and a fluorescent converter using the metal oxide-based phosphor microfine particles are inhibited from scattering light emitted from a light source, and are extremely practical and useful for emitting a fluorescence by converting an excited light emitted from the light source into light having a longer wavelength when disposed on the light source.

PREFERRED EMBODIMENTS FOR CARRYING OUT THE INVENTION

Figure 1:
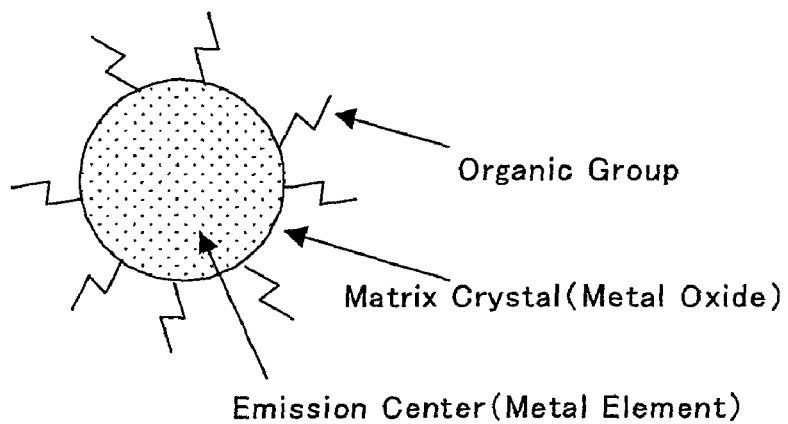
FIG. 1 is an explanatory view showing a structure of metal oxide-based phosphor microfine particles of the present invention.

The metal oxide-based phosphor microfine particles of the present invention include a matrix crystal made of a metal oxide and a metal element doped as an emission center into the matrix crystal, wherein said microfine particles are provided with an organic group coordinated to a surface thereof, as shown in FIG. 1.

Figure 2:
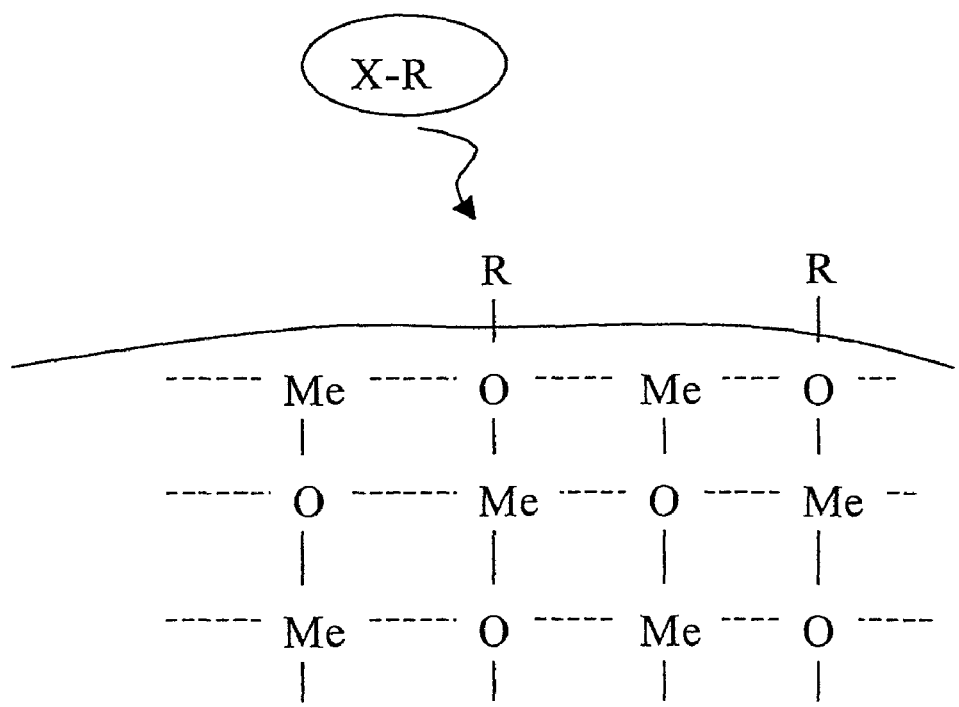
FIG. 2 is an explanatory view showing a surface condition of metal oxide-based phosphor microfine particles of the present invention.

The organic group is derived from an organic compound having one or more functional groups at a terminal end or a side chain thereof by dissociating at least one of the function groups from the organic compound. The organic group is coordinated to a metal atom or an oxygen atom of the metal oxide in the matrix crystal. When the organic group is coordinated to the oxygen atom, for example, as shown in FIG. 2, a functional group X is dissociated from an organic compound (X—R), and the resultant organic group R is coordinated to the oxygen atom. Meanwhile, in FIG. 2, Me represents a metal atom, and O represents an oxygen atom.

The matrix crystal is preferably made of one or more kinds of metal oxides. Examples of the metal oxides include $BO_3$, $B_4O_{12}$, $BaAl_8O_{13}$, $BaAl_{12}O_{19}$, $BaB_5O_9Br$, $BaMgAl_{10}O_{17}$, $BaMgAl_{14}O_{23}$, $BaGdNbO_5$, $BaSi_2O_5$, $BaSO_4$, $BeAl_2O_4$, $CaAl_{12}O_{19}$, $CaAl_2O_3$, $CaMgSi_2O_7$, $CaO$, $CaSiO_3$, $CaWO_4$, $Cd_2B_2O_5$, $CeMgA_{11}O_{19}$, $GdBO_3$, $Gd_3Ga_5O_{12}$, $GdMgB_5O_{10}$, $Gd_2O_2S$, $Gd_2SiO_5$, $Gd_2(MoO_4)_3$, $InBO_3$, $LaBO_3$, $La_2O_2S$, $LaOBr$, $LaOCl$, $Mg_6As_2O_{11}$, $MgB_4O_7$, $MgSiO_3$, $Mg_2SiO_4$, $Mg_2TiO_4$, $ScBO_3$, $SiO_2$, $SnO_2$, $SrAl_2O_4$, $Sr_4Al_{14}O_{25}$, $SrAl_{12}O_{19}$, $SrB_6O_{10}$, $Sr_2P_2O_7$, $SrSb_2O_6$, $Sr_4Si_3O_8Cl_4$, $U_2O_3$, $YAlO_3$, $Y_3Al_5O_{12}$, $(Y_xGd_{1-x})_3Al_5O_{12}$, $ZnGa_2O_4$, $Y_4Al_2O_9$, $YAl_3B_4O_{12}$, $Y_3(Al_xGa_{1-x})_5O_{12}$, $Y_3Al_3Ga_2O_{12}$, $YBO_3$, $(Y_xGd_{1-x})_2OS$, $(Y_xGd_{1-x})_2O_3$, $YPO_4$, $Y(P_xV_{1-x})O_4$, $Y_2SiO_5$, $YTaO_4$, $Y_2O_3$, $Y_2O_2S$, $YVO_4$, $Zn_2SiO_4$ and $(Zn_xBe_{1-x})_2SiO_4$. Among these metal oxides, preferred are $Y_3Al_5O_{12}$, $(Y_xGd_{1-x})_3Al_5O_{12}$, $Y_3(Al_xGa_{1-x})_5O_{12}$, $Y_2O_3$ and $(Y_xGd_{1-x})_2O_3$.

Meanwhile, for example, the formula "$(Y_xGd_{1-x})_3Al_5O_{12}$" means that (1–x) % by atom of yttrium (Y) in the crystal lattice of $Y_3Al_5O_{12}$ is replaced with gadolinium (Gd).

The metal element as an emission center is added as an impurity in the form of a metal atom or an ion into the metal oxide in the matrix crystal, and is present in the form of a solid solution in the matrix crystal. The metal element is transferred to an excited state by absorbing light emitted from an excitation light source, and emits light when the excited state is deactivated and returned to its ground state. Examples of the metal element as the emission center include the following elements:

(A) Metal elements belonging to Groups II, III, IV, V and VI of the Periodic Table: antimony ion ($Sb^{3+}$), tin ion ($Sn^{2+}$), lead ion ($Pb^{2+}$), thallium ion ($Tl^+$) and mercury atom (Hg);

(B) Transition metal elements: manganese ion ($Mn^{2+}$, $Mn^{4+}$) and chromium ion ($Cr^{3+}$); and (C) Rare earth metal elements: $La^{3+}$, $Lu^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Sm^{2+}$, $Eu^{2+}$, $Yb^{2+}$ and $Ce^{3+}$.

Among the above elements, preferred are rare earth metal element ions, and more preferred is at least one element selected from the group consisting of europium (Eu), terbium (Tb), praseodymium (Pr), cerium (Ce), samarium (Sm), thulium (Tm), dysprosium (Dy) and lutetium (Lu) in view of a high emission efficiency thereof.

Also, a suitable combination of the metal element of the metal oxide in the above matrix crystal and the metal element as the emission center includes, for example, such a combination in which the metal element of the metal oxide in the matrix crystal is at least one element selected from the group consisting of yttrium (Y), aluminum (Al), gadolinium (Gd), lanthanum (La), gallium (Ga) and barium (Ba), and the metal element as the emission center is at least one element selected from the group consisting of europium (Eu), cerium (Ce) and terbium (Tb).

Specific examples of compounds obtained by using the suitable combination of these metal elements in which europium (Eu) is used as the metal element as the emission center include $BaAl_8O_{13}:Eu^{2+}$, $BaMgAl_{10}O_{17}:Eu^{2+}$, $BaMgAl_{14}O_{23}:Eu^{2+}$, $Y_2O_3:Eu^{2+}$, $Ba_2GdNbO_5:Eu^{3+}$, $BaMgAl_{10}O_{17}:Eu^{3+}$, $BaMg_2Al_{16}O_{27}:Eu^{3+}$, $GdBO_3:Eu^{3+}$, $LuBO_3:Eu^{3+}$, $Y_3Al_5O_{12}:Eu^{3+}$, $YBO_3:Eu^{3+}$, $(Y_xGd_{1-x})_2O_3:Eu^{3+}$, $Y_2O_2S:Eu^{3+}$ and $Y_2O_3:Eu^{3+}$. Specific examples of compounds obtained by using the suitable combination of these metal elements in which cerium (Ce) is used as the metal element as the emission center include $Gd_2SiO_5:Ce^{3+}$, $LaBO_3:Ce^{3+}$, $LaPO_4:Ce^{3+}$, $YAl_3B_4O_{12}:Ce^{3+}$, $Y_3Al_3Ga_2O_2:Ce^{3+}$, $Y_3(Al_xGa_{1-x})_5O_{12}:Ce^{3+}$, $(Y_xGa_{1-x})_3Al_5O_{12}:Ce^{3+}$, $Y_2SiO_5:Ce^{3+}$, $LuAlO_3:Ce^{3+}$ and $Lu_2SiO_5:Ce^{3+}$. Specific examples of compounds obtained by using the suitable combination of these metal elements in which terbium (Tb) is used as the metal element as the emission center include $CeMgAl_{11}O_{19}:Tb^{3+}$, $Gd_2O_2S:Tb^{3+}$, $GdBO_3:Tb^{3+}$, $GdMgB_5O_{10}:Tb^{3+}$, $(Gd_xY_{1-x})O_2S:Tb^{3+}$, $LaPO_4:Tb^{3+}$, $LuBO_3:Tb^{3+}$, $Y_3(Al_xGa_{1-x})_5O_{12}:Tb^{3+}$, $Y_3Al_3Ga_2O_{12}:Tb^{3+}$, $Y_3Al_5O_{12}:Tb^{3+}$ and $Y_2SiO_5:Tb^{3+}$.

The organic group is obtained from an organic compound having one or more functional groups bonded to a terminal end or a side chain thereof by dissociating at least one of the functional groups from the organic compound.

Examples of the organic group include a substituted or unsubstituted alkyl group having 1 to 50 carbon atoms, a substituted or unsubstituted alkenyl group having 1 to 50 carbon atoms, a substituted or unsubstituted alkoxy group having 1 to 50 carbon atoms, a substituted or unsubstituted cycloalkyl group having 1 to 50 carbon atoms, a substituted or unsubstituted aryl group having 6 to 50 carbon atoms, a substituted or unsubstituted heteroaryl group having 5 to 50 carbon atoms, a substituted or unsubstituted aralkyl group having 7 to 50 carbon atoms and a substituted or unsubstituted aryloxy group having 5 to 50 carbon atoms.

Specific examples of the substituted or unsubstituted alkyl group include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisopropyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-buty, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl and 1,2,3-trinitropropyl.

Specific examples of the substituted or unsubstituted alkenyl group include vinyl, allyl, 1-butenyl, 2-butenyl, 3-butenyl, 1,3-butanedienyl, 1-methylvinyl, stearyl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl and 3-phenyl-1-butenyl. Among these alkenyl groups, preferred are stearyl, 2,2-diphenylvinyl and 1,2-diphenylvinyl.

The substituted or unsubstituted alkoxy group may be groups represented by the formula: —OY. Examples of the Y group include those alkyl groups as specifically exemplified above.

Specific examples of the substituted or unsubstituted cycloalkyl group include cyclopropyl, cyclobutyl, cyclopentyl, cyclohexyl, 4-methylcyclohexyl, 1-adamantyl, 2-adamantyl, 1-norbornyl and 2-norbornyl.

Specific examples of the substituted or unsubstituted aryl group include phenyl, 1-naphthyl, 2-naphthyl, 1-anthryl, 2-anthryl, 9-anthryl, 1-phenathryl, 2-phenathryl, 3-phenathryl, 4-phenathryl, 9-phenathryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl and 4"-t-butyl-p-terphenyl-4-yl.

Specific examples of the substituted or unsubstituted heteroaryl group include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthrolin-2-yl, 1,7-phenanthrolin-3-yl, 1,7-phenanthrolin-4-yl, 1,7-phenanthrolin-5-yl, 1,7-phenanthrolin-6-yl, 1,7-phenanthrolin-8-yl, 1,7-phenanthrolin-9-yl, 1,7-phenanthrolin-10-yl, 1,8-phenanthrolin-2-yl, 1,8-phenanthrolin-3-yl, 1,8-phenanthrolin-4-yl, 1,8-phenanthrolin-5-yl, 1,8-phenanthrolin-6-yl, 1,8-phenanthrolin-7-yl, 1,8-phenanthrolin-9-yl, 1,8-phenanthrolin-10-yl, 1,9-phenanthrolin-2-yl, 1,9-phenanthrolin-3-yl, 1,9-phenanthrolin-4-yl, 1,9- phenanthrolin-5-yl, 1,9-phenanthrolin-6-yl, 1,9-phenanthrolin-7-yl, 1,9-phenanthrolin-8-yl, 1,9-phenanthrolin-10-yl, 1,10-phenanthrolin-2-yl, 1,10-phenanthrolin-3-yl, 1,10-phenanthrolin-4-yl, 1,10-phenanthrolin-5-yl, 2,9-phenanthrolin-1-yl, 2,9-phenanthrolin-3-yl, 2,9-phenanthrolin-4-yl, 2,9-phenanthrolin-5-yl, 2,9-phenanthrolin-6-yl, 2,9-phenanthrolin-7-yl, 2,9-phenanthrolin-8-yl, 2,9-phenanthrolin-10-yl, 2,8-phenanthrolin-1-yl, 2,8-phenanthrolin-3-yl, 2,8-phenanthrolin-4-yl, 2,8-phenanthrolin-5-yl, 2,8-phenanthrolin-6-yl, 2,8-phenanthrolin-7-yl, 2,8-phenanthrolin-9-yl, 2,8-phenanthrolin-10-yl, 2,7-phenanthrolin-1-yl, 2,7-phenanthrolin-3-yl, 2,7-phenanthrolin-4-yl, 2,7-phenanthrolin-5-yl, 2,7-phenanthrolin-6-yl, 2,7-phenanthrolin-8-yl, 2,7-phenanthrolin-9-yl, 2,7-phenanthrolin-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl and 4-t-butyl-3-indolyl.

Specific examples of the substituted or unsubstituted aralkyl group include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl and 1-chloro-2-phenylisopropyl.

The substituted or unsubstituted aryloxy group is represented by the formula: —OY'. Examples of the Y' group include those aryl groups as specifically exemplified above.

Although the respective groups as specifically exemplified above are in the form of a monovalent group, there may also be used di- or more valent groups formed by further dissociating one or more hydrogen atoms therefrom as well as those group obtained by substituting the hydrogen atoms with the following functional groups.

The metal oxide-based phosphor microfine particles of the present invention have an average particle size as small as 1 to 100 nm and preferably 1 to 60 nm.

Examples of the functional groups include those groups having at least one proton which are represented by the formula: $ZH_n$ wherein Z is an element belonging to Group 15 or 16 of the Periodic Table; and n is an integer of 1 or more. Among these functional groups, preferred are OH; $NH_2$, SH and NHR' wherein R' is an alkyl group, and more preferred is OH.

Examples of the organic compound having one or more functional groups at a terminal end or a side chain thereof include isobutyl alcohol, 1,4-butanediol, 1,5-pentanediol, 1,6-hexanediol, glycerol, ethylene glycol, trimethylene glycol, 1,3-propanediol, 1,4-hydroxybenzene, 1,3-hydroxybenzene, 1,2-hydroxybenzene, 2-hydroxyethylmercaptan and 2-hydroxyethylamine. Among these organic compounds, preferred are 1,4-butanediol, glycerol and ethylene glycol.

The coordination of the above organic group to a surface of the metal oxide-based phosphor microfine particles of the present invention may be determined by TG-DTA (thermogravimetric differential thermal analysis) method or the like. For example, the coordination of an organic group "$(CH_2)_4OH$" formed by dissociating a terminal OH group from 1,4-butanediol "$OH(CH_2)_4OH$" to the surface of the respective microfine particles may be determined by continuous reduction in weight of the microfine particles which is observed when the microfine particles are continuously heated beyond a boiling point (229° C.) of 1,4-butanediol. When the metal oxide-based phosphor microfine particles having the organic group coordinated to the surface thereof are continuously heated, the weight thereof is continuously reduced owing to thermal decomposition of the organic group.

Figure 3:
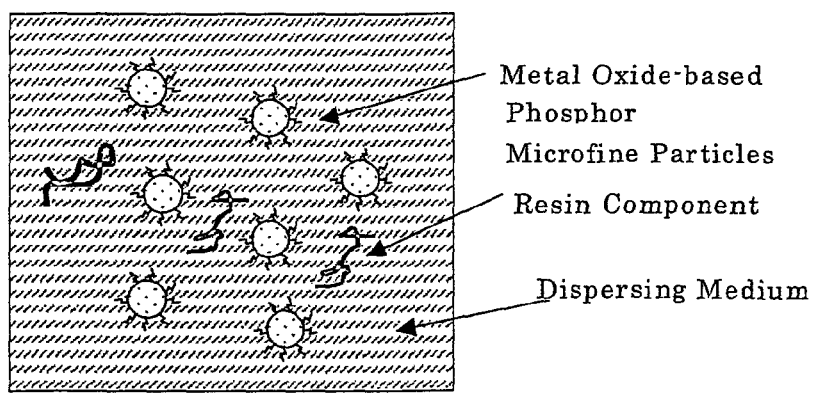
FIG. 3 is an explanatory view showing a dispersion of metal oxide-based phosphor microfine particles of the present invention.

The dispersion of the metal oxide-based phosphor microfine particles according to the present invention is constituted from, as shown in FIG. 3, (a) a dispersing medium containing an organic compound having one or more functional groups bonded to a terminal end or a side chain thereof; and (b) the metal oxide-based phosphor microfine particles comprising a matrix crystal made of a metal oxide and a metal element doped as an emission center into the matrix crystal, wherein said microfine particles are provided with an organic group coordinated to a surface thereof which is formed by dissociating at least one of the functional groups from the organic compound.

Thus, the dispersion of the metal oxide-based phosphor microfine particles according to the present invention contains the metal oxide-based phosphor microfine particles of the present invention as the component (b), and the dispersing medium containing the same kind of organic compound as used in the component (b) and, therefore, can exhibit a very good dispersibility.

The dispersing medium as the component (a) may also contain, in addition to the above organic compound, other known components. Examples of the other known components include ketones such as methyl ethyl ketone, methyl isobutyl ketone and cyclohexanone; cellosolves such as methyl cellosolve, ethyl cellosolve, butyl cellosolve and cellosolve acetate; lactones such as γ-butyrolactone; and polyethylene glycol.

The dispersion of the metal oxide-based phosphor microfine particles according to the present invention may further contain (c) a resin component.

Examples of the resin component include non-curable-type resins, heat-curable resins and photocurable resins. Specific examples of the resin component include oligomers or polymers such as melamine resins, phenol resins, alkyd resins, epoxy resins, polyurethane resins, maleic acid resins, polyamide resins, polymethyl methacrylate, polyallylates, polycarbonates, polyvinyl alcohol, polyvinyl pyrrolidone, hydroxyethyl cellulose and carboxymethyl cellulose, and copolymers containing constitutional monomers of these oligomers or polymers.

Among these resins, in particular, in the case where the fluorescent conversion film should be patterned into an optional shape, there may be used photocurable resin components. As the photocurable resin, there may be used reactive vinyl group-containing photopolymerizable resins such as acrylic acid-based or methacrylic acid-based resins and methacrylic ester-methacrylic acid copolymers, which usually contain a photosensitive agent; and photo-crosslinkable resins such as polyvinyl cinnamate. Further, the photocurable resins may also contain, if required, monomers and/or oligomers having a photopolymerizable ethylenically unsaturated group, a photopolymerization initiator or a sensitizer.

Specific examples of the above monomers and oligomers include hydroxyl-containing monomers such as 2-hydroxyethyl(meth)acrylate, 2-hydroxypropyl(meth)acrylate and 2-hydroxyhexyl(meth)acrylate, and (meth)acrylic esters such as ethylene glycol (meth)acrylate and diethylene glycol (meth)acrylate.

Examples of the suitable photopolymerization initiator or sensitizer include acetophenones, benzophenones, benzoin ethers, sulfur compounds, anthraquinones, organic peroxides and thiols.

Also, when the dispersion of the metal oxide-based phosphor microfine particles according to the present invention is used as a material for forming the fluorescent conversion film as explained in detail below, a light-transmittable resin is preferably used as the resin component (c). The light-transmittable resin means such a resin capable of transmitting light emitted from an excitation light source or a phosphor at a transmittance of 30% or more. Examples of such a light-transmittable resin include those resin components as specifically exemplified above.

Further, the dispersion of the metal oxide-based phosphor microfine particles according to the present invention may also contain, if required, various additives such as curing accelerators, thermal polymerization inhibitors, plasticizers, defoaming agents and leveling agents. Specific examples of the curing accelerators include perbenzoic acid derivatives, peracetic acid and benzophenones. Specific examples of the thermal polymerization inhibitors include hydroquinone, hydroquinone monomethyl ether, pyrogallol, t-butyl catechol and phenothiazine. Specific examples of the plasticizers include dibutyl phthalate, dioctyl phthalate and tricresyl.

Figure 4:
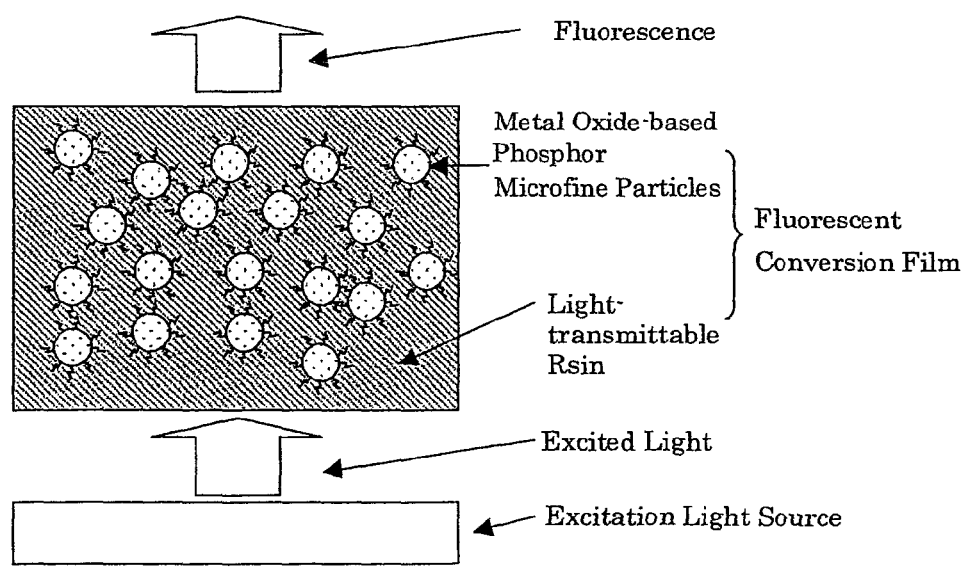
FIG. 4 is an explanatory view showing a function of a fluorescent conversion film of the present invention.

The fluorescent conversion film of the present invention is constituted of a light-transmittable resin and the metal oxide-based phosphor microfine particles of the present invention which are dispersed in the light-transmittable resin, as shown in FIG. 4.

Examples of the light-transmittable resin include those resins as exemplified above.

The method of producing the fluorescent conversion film is not particularly limited. The fluorescent conversion film may be produced by applying a dispersion obtained by mixing the metal oxide-based phosphor microfine particles of the present invention, the dispersing medium and the light-transmittable resin with each other onto s substrate by a known film-forming method such as spin-coating, screen-coating, dip-coating and ink-jetting. After completion of forming the film, the resultant film may be appropriately heated depending upon a boiling point of the dispersing medium, a vapor pressure and a thickness of the film to evaporate the dispersing medium from the film, thereby obtaining the fluorescent conversion film containing the metal oxide-based phosphor microfine particles dispersed in the light-transmittable resin.

The thickness of the thus obtained fluorescent conversion film is usually from 0.1 µm to 1 mm and preferably from 1 µm to 100 µm.

The content of the metal oxide-based phosphor microfine particles in the fluorescent conversion film is usually from 0.1 to 90% by mass and preferably from 1 to 70% by mass. When the content of the metal oxide-based phosphor microfine particles is 0.1% by mass or more, the resultant fluorescent conversion film is capable of fully absorbing light emitted from an excitation light source, resulting in a large intensity of the finally obtained fluorescence. Also, when the content of the metal oxide-based phosphor microfine particles is 90% by mass or less, the resultant fluorescent conversion film can exhibit a good smoothness and a high mechanical strength.

The fluorescent conversion film, the fluorescent liquid, the fluorescent paste, the phosphor and the fluorescent converter according to the present invention are functioned as follows. For example, as illustrated in FIG. 4, the fluorescent conversion film is disposed on an excitation light source, and allow excited light emitted from the excitation light source to pass therethrough such that the light passed therethrough is converted into light having a longer wavelength (e.g., blue light is converted into green or red light), thereby generating a fluorescence. Examples of the excitation light source include organic electroluminescent devices, inorganic electroluminescent devices, light-emitting diodes, cold cathode tubes, fluorescent tubes and lasers. Among these light sources, preferred are organic electroluminescent devices and light-emitting diodes.

Next, the process for producing the metal oxide-based phosphor microfine particles according to the present invention is explained.

Figure 5:
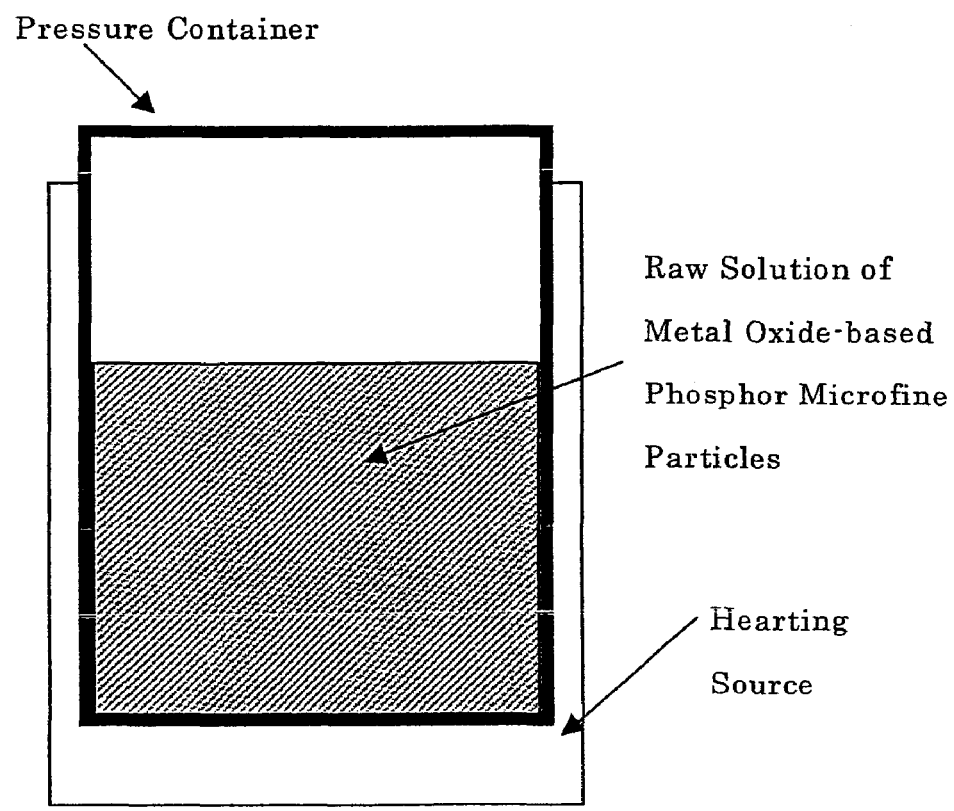
FIG. 5 is an explanatory view showing a process for producing metal oxide-based phosphor microfine particles according to the present invention.

In the process for producing the metal oxide-based phosphor microfine particles according to the present invention includes, as shown in FIG. 5, a compound of a metal element forming a matrix made of a metal oxide and a compound of a metal element as an emission center are dissolved or dispersed in a dispersing medium containing an organic compound having one or more functional groups bonded to a terminal end or a side chain thereof to prepare a raw solution, and the thus prepared raw solution is enclosed in a pressure container and heated at a temperature not lower than a boiling point of the organic compound.

More specifically, the production process generally includes the following three steps, i.e., (1) selection, blending and charging of raw materials (source of the matrix-forming metal oxide, source of the metal element as the emission center, the organic compound, and the dispersing medium); (2) heating; and (3) purification. The respective steps are sequentially explained below.

(1) Selection and Blending of Raw Materials

Specific examples of supply sources of the metal element forming the matrix-forming metal oxide constituting the metal oxide-based phosphor microfine particles of the present invention and the metal element as the emission center include carbonates, acetates, nitrates, hydroxides, sulfates, phosphates, borates, silicates, aluminates, carboxylates, halides and alkoxides of the metal element forming the matrix-forming metal oxide and the metal oxide as the emission center as well as hydrates of these compounds. These compounds are blended with each other at a desired mixing ratio capable of producing the aimed compound by an ordinary method, and dissolved and dispersed in the above dispersing medium to prepare the raw solution. The thus prepared raw solution enclosed in a pressure container such as typically an autoclave.

As the dispersing medium containing an organic compound having one or more functional groups bonded to a terminal end or a side chain thereof, there may be used those dispersing media as explained above with respect to the dispersion of the metal oxide-based phosphor microfine particles.

Figure 6:
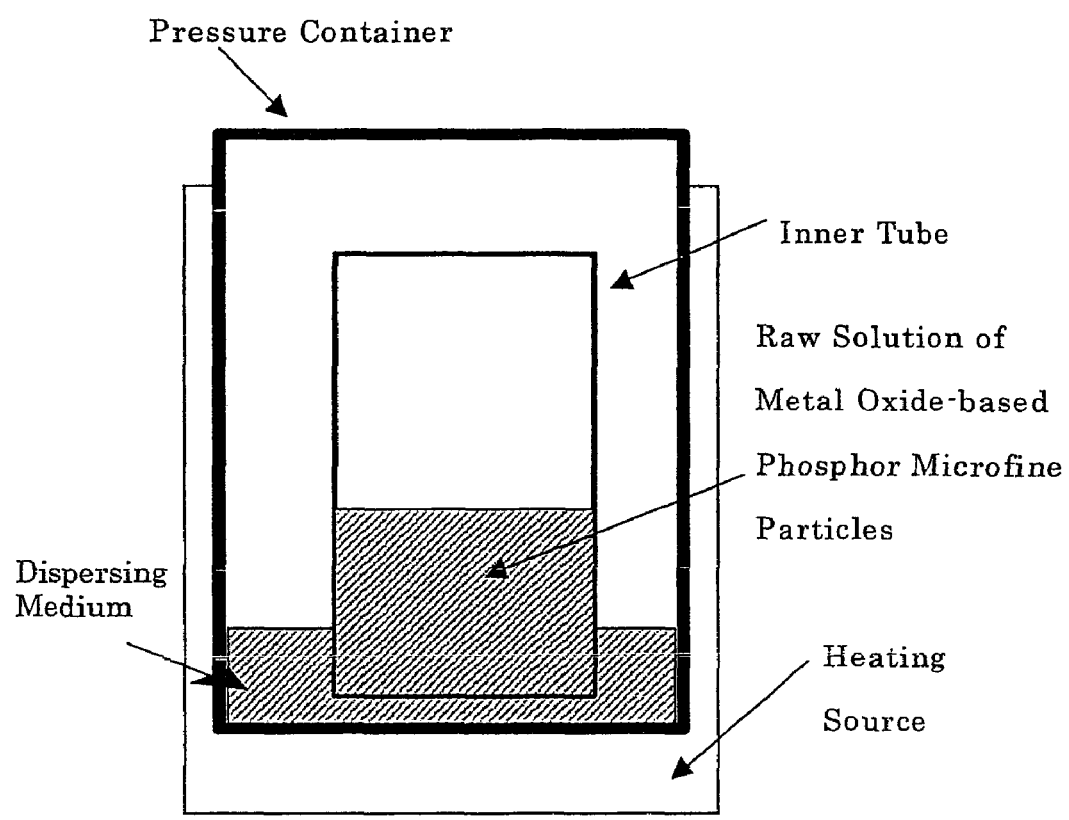
FIG. 6 is another explanatory view showing a process for producing metal oxide-based phosphor microfine particles according to the present invention.

The mixing ratio of a sum of the compound of the metal element forming the matrix-forming metal oxide and the metal element as the emission center (metal compounds) to the dispersing medium may be determined depending upon a desired solid content in the finally obtained dispersion and uniformity of the raw materials. The mixing ratio of the metal compounds to the dispersing medium is usually from 0.1:100 to 50:50 (mass ratio) and preferably from 1:99 to 50:50. In the case where the proportion of the dispersing medium in the raw solution is not increased so that the pressure in the pressure container during the below-mentioned heating step is kept low, it is effective to adopt such a method as shown in FIG. 6 in which an inner tubular container filled with the raw solution prepared by mixing the respective components at a given mixing ratio is enclosed in the pressure container filled with the dispersing medium solely.

Also, the volume ratio of an inner capacity of the pressure container to the raw solution (capacity ratio) is preferably as large as possible in order to shorten the below-mentioned heating time. More specifically, the volume ratio is preferably 40% or more and more preferably 60% or more.

(2) Heating

In order to accelerate the reaction of the raw solution, heat is supplied from an external heating source disposed outside of the pressure container. In general, the production of the metal oxide-based phosphor microfine particles requires baking at a high temperature such as usually 800° C. or higher. However, in the process for producing the metal oxide-based phosphor microfine particles according to the present invention, the reaction can be conducted at a temperature as low as, for example, 200 to 500° C. since the reaction proceeds under a high-temperature condition. For this reason, the particles obtained by the process of the present invention have a smaller particle size than those obtained by ordinary conventional processes. More specifically, in the process of the present invention, it is required to raise the reaction pressure in the pressure container, and the heating temperature is not less than a boiling point of the dispersing medium used. In the process of the present invention, the reaction may be conducted under a pressure of usually 0.5 to 10 MPa and preferably 1 to 8 MPa.

The heating time may be appropriately determined because the pressure to be reached varies depending upon kind of aimed metal oxide-based phosphor microfine particles, raw compounds and kind of dispersing medium used, and is usually in the range of from 1 to 10 h. When the heating time is shorter than 1 h, the resultant microfine particles exhibit a low crystallinity, thereby failing to attain a sufficient fluorescence intensity. On the other hand, when the heating time is longer than 10 h, the resultant microfine particles tend to suffer from inclusion of impurities owing to carbonization of the dispersing medium or accelerated secondary agglomeration thereof.

(3) Purification

After completion of the reaction, the obtained reaction product is cooled to room temperature. If required, the reaction product is subjected to centrifugal separation, and the residual precipitate is mixed with an organic solvent and then subjected again to centrifugal separation. Upon the conventional production processes using known methods such as co-precipitation method and sol-gel method, after completion of the reaction, in order to increase a crystallinity of the resultant particles, it has been required that the particles are baked at a high temperature such as 1000° C. or higher. In such a case, the particles tend to suffer from accelerated secondary agglomeration, so that the obtained fine particles have a particle size as large as 100 nm or more. On the contrary, in the production process of the present invention, since no baking is required after the reaction, it is possible to obtain microfine particles having a smaller particle size. Further, if it is required to purify the reaction product, the resultant particles may be mixed with an organic solvent and repeatedly subjected to centrifugal separation plural times.

The method of separating metal oxide-based phosphor microfine particles according to the present invention includes the step of subjecting a mixture of the metal oxide-based phosphor microfine particles and a solvent to centrifugal separation, filtration, natural sedimentation or combination thereof for classifying the microfine particles to thereby separate transparent metal oxide-based phosphor microfine particles containing the solvent from the mixture.

In addition, the method of separating metal oxide-based phosphor microfine particles according to the preferred embodiment of the present invention includes the steps of mixing a mixture of the metal oxide-based phosphor microfine particles and a solvent, with a solvent capable of varying a dispersing condition of the microfine particles; and subjecting the resultant mixture to centrifugal separation, filtration, natural sedimentation or combination thereof for classifying the microfine particles to thereby separate transparent metal oxide-based phosphor microfine particles containing the solvent from the mixture. As the solvent capable of varying a dispersing condition of the microfine particles, there may be suitably used, for example, the solvents used for producing the metal oxide-based phosphor microfine particles below, or water. These solvents can exhibit a function of varying the dispersing condition of the microfine particles. For example, when the solvent used in synthesis of the phosphor (for example, 1,4-butanediol) is added to the mixture, the ratio of the dispersed microfine particles to the solvent is varied, resulting in change in adsorption equilibrium and, therefore, change in dispersibility. Also, when an organic solvent such as acetone is added to the mixture, the dispersing condition of the microfine particles tends to become unstable, resulting in accelerated precipitation thereof. Typical examples of the solvents capable of varying a dispersing condition of the microfine particles include linear or branched alcohols, monohydric alcohols, polyhydric alcohols, alkanes, ketones, ethers, esters, aromatic solvents and water. The solvent may be appropriately added in an optimum amount in view of the dispersing condition of the microfine particles.

The fluorescent liquid of the present invention is a transparent fluorescent liquid which contains a solvent and 10% by weight or more of the metal oxide-based phosphor microfine particles of the present invention, wherein light emitted from the metal oxide-based phosphor microfine particles which has a wavelength attributed to a metal oxide contained therein is transmitted through the fluorescent liquid at a transmittance of 50% or more in terms of an optical path length of 1 cm. Meanwhile, the "fluorescent liquid" used herein generally means a liquid having a viscosity of 50,000 cp or less, in a narrow sense, a liquid having a viscosity of 1,000 cp or less.

The fluorescent paste of the present invention is a transparent fluorescent paste which contains a solvent and 50% by weight or more of the metal oxide-based phosphor microfine particles of the present invention, wherein light emitted from the metal oxide-based phosphor microfine particles which has a wavelength attributed to a metal oxide contained therein is transmitted through the fluorescent paste at a transmittance of 50% or more in terms of an optical path length of 150 μm. Meanwhile, the "fluorescent paste" used herein generally means a liquid having a viscosity of 1,000 cp or more, in a narrow sense, a liquid having a viscosity of 50,000 cp or more.

Examples of the solvents used in the fluorescent liquid and the fluorescent paste include, in addition to 1,4-butanediol, linear or branched alcohols, monohydric alcohols, polyhydric alcohols, alkanes, ketones, ethers, esters, aromatic solvents and water.

The fluorescent liquid and the fluorescent paste are respectively baked at a temperature of 500° C. or lower to obtain a phosphor in the form of a transparent solid. The baking atmosphere may be appropriately selected from air, an inert gas, etc.

The fluorescent converter of the present invention is composed of either the phosphor of the present invention solely or a product obtained by adding a resin and/or a solvent to the phosphor and solidifying the obtained mixture. Also, the fluorescent converter of the present invention is obtained by dispersing the phosphor of the present invention in a resin and/or a solvent.

The resin used in the fluorescent converter of the present invention is not particularly limited, and any suitable known resins may be used therefor. Examples of the resin include the same resins as exemplified as the resin component (c).

The solvent used in the fluorescent converter is not particularly limited, and any suitable known solvents may be used therefor.

Figure 17:
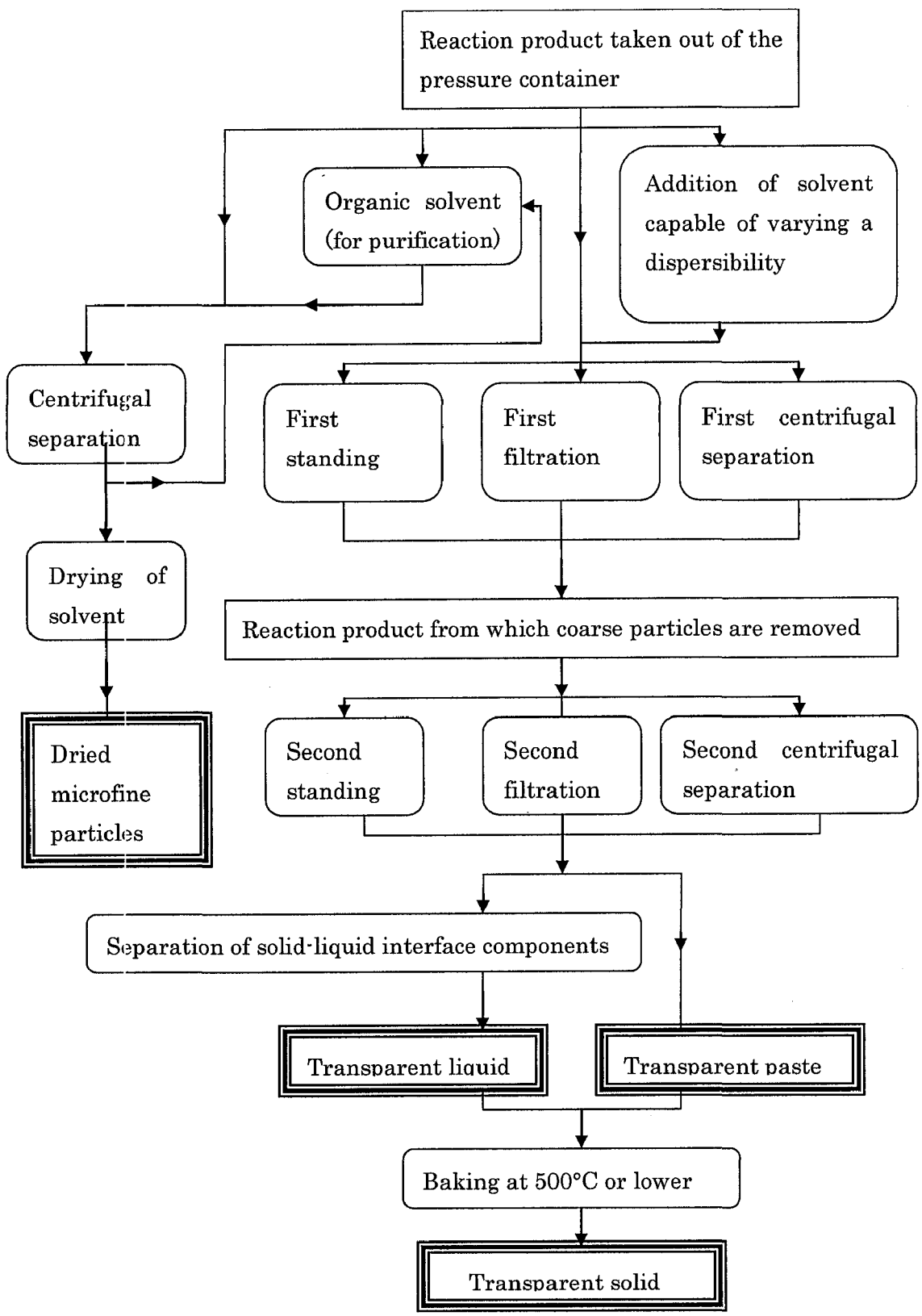
FIG. 17 is a flow chart showing an exemplary process for producing an exemplary phosphor according to the present invention in which an exemplary separation method according to the present invention is employed.

The process for producing the phosphor according to the present invention to which the separation method of the present invention is applied is specifically explained below with reference to the flow chart shown in FIG. 17. Meanwhile, in the flow chart shown in FIG. 17, the respective steps may be performed through any suitable route along the direction indicated by the arrow as long as the final separation product can be obtained.

(4) Separation of Metal Oxide-Based Phosphor Particles Through Production of Phosphor After completion of the reaction in the above step (2), the resultant reaction product is cooled to room temperature. Then, a phosphor in the form of a mixture composed of the metal oxide-based phosphor microfine particles, the organic group coordinated to the surface of the respective metal oxide-based phosphor microfine particles and the solvent is separated from the reaction product. In this case, by selecting appropriate conditions, it is possible to separate a transparent phosphor. The separation procedure may be performed in the following order. First, in order to facilitate the subsequent separation treatment, one to several kinds of the above solvents capable of varying a dispersing condition of the microfine particles are added to the reaction product. The amount of the solvents added is from 1/20 to 2/1 and preferably from 1/5 to 1/1 on the basis of the volume of the reaction product. After adding the solvents, the obtained mixture may be subjected to accelerated mixing treatment using an ultrasonic homogenizer or a mechanical homogenizer. Alternatively, if the phosphor can be readily separated from the reaction product in the subsequent separation treatment owing to the condition of the reaction product, it is not required to add the solvents thereto.

Next, the reaction product is subjected to the first standing, the first filtration or the first centrifugal separation to remove coarse particles therefrom (classification). The coarse particles to be removed include those particles having a particle size of usually 1 µm or more, preferably 0.1 µm or more and more preferably 0.01 µm or more. Then, the reaction product from which the coarse particles are removed is subjected to the second standing, the second filtration or the second centrifugal separation to remove classified microfine particles therefrom. At this time, the first and second standing times may be respectively appropriately selected from the range of from one day to about one month depending upon the extent of production of the microfine particles. Although the first and second filtration procedures may be performed by using any filter as long as the coarse and microfine particles are respectively suitably separated thereby, the filtration for the dispersion of the microfine particles is preferably conducted using a filter having a large filtering area, for example, a hollow fiber filter, a bobbin filter, a membrane cartridge filter or combination of a plurality of these filters. The first and second centrifugal separation procedures may be performed under a centrifugal force of usually from 100 g to 100000 g and preferably from 1000 g to 5000 g for a treating time of usually from 10 min to 3 h and preferably from 30 min to 60 min. The precipitate obtained after the centrifugal separation may be separated by decantation. In this case, a transparent phosphor dispersion having a low solid content is produced in the vicinity of the solid-liquid interface. When the above solvents capable of varying a dispersing condition of the microfine particles is added in the separation procedure, the solvents are removed under a nitrogen gas flow or by vacuum drying, if required.

The thus separated phosphor is present in a paste state. Further, the paste is baked at a temperature of usually 500° C. or lower, preferably 400° C. or lower and more preferably from 250 to 300° C., for example, under a nitrogen gas flow, to obtain a transparent phosphor (solid). The baking time varies depending upon a total amount of the paste to be treated, and is suitably from about 10 min to about 1 h.

EXAMPLES

The present invention is described in more detail by referring to the following examples. However, it should be noted that these examples are only illustrative and not intended to limit the invention thereto.

The respective measurements were performed by the following methods.

(1) Identification by X-Ray Diffraction

The resultant reaction product particles fixed on a glass substrate were used as a sample to measure an X-ray diffraction angle and diffraction intensity using an X-ray diffractometer "Rint 2200" available from Rigaku Denki Co., Ltd., thereby obtaining the relationship therebetween. The identification of the obtained particles was conducted by comparing the results with JCPDS card (powder X-ray diffraction data base edited by JCPDS (Joint Committee on Powder Diffraction Standards) of ICDD (International Center for Diffraction Data)).

(2) ICP Quantitative Analysis

On a platinum dish were placed 0.02 g of the resultant reaction product particles, and a mixed solvent composed of water, sulfuric acid and hydrochloric acid was added thereto to dissolve the particles in the mixed solvent, thereby obtaining a sample solution. The sample solution was subjected to ICP emission spectral analysis to measure a mass percent of respective metal elements contained in the sample solution.

(3) Measurement of Average Particle Size by Dynamic Light Scattering

One milliliter of 1,4-butanediol was added to 0.02 g of the resultant reaction product particles, and the obtained mixture was dispersed for 10 min while applying an ultrasonic wave thereto to prepare a dispersion. Several droplets of the thus obtained dispersion were added to 30 mL of ultrapure water, and the obtained mixture was further dispersed for 10 min while applying an ultrasonic wave thereto to prepare a sample. The thus obtained sample was tested using a dynamic light scattering measuring apparatus "HPPS (model name)" available from Malvern Instruments Inc., to measure a number-average particle size distribution thereof.

Meanwhile, in pace of the dispersion produced from the particles as described above, there may also be used such a sample obtained by directly adding the reaction product solution produced by keeping under heating and cooling to room temperature, to ultrapure water and then subjecting the resultant mixture to the same subsequent procedure as described above.

(4) Measurement of Fluorescence Intensity

The resultant particles were filled in a quartz cell to measure a peak wavelength $\lambda_{EX}$ of an excitation spectrum thereof using a fluorescent spectrophotometer "FP-6500" available from Nippon Bunkko Co., Ltd. Next, a peak wavelength $\lambda_{EM}$ and a peak intensity I of a fluorescence spectrum obtained by using $\lambda_{EX}$ as an excitation wavelength, were measured.

Similarly, a thin film sample was prepared by using a thin film in place of the above quartz cell, and a magnesium oxide plate having a high diffuse reflectance was disposed on a back surface of the thin film sample to efficiently measure a fluorescence emitted in the backward direction. The excited light was irradiated onto the thin film at an incident angle of 45° to measure a fluorescence generated in the direction of 45° and a peak intensity thereof.

(5) Measurement of Transmittance Using Spectrophotometer

A transmittance of the phosphor sample was measured using an ultraviolet/visible light spectrophotometer "UV3100" available from Shimadzu Seisakusho Co., Ltd. The thin film sample was grasped by a thin film holder to measure a transmittance to light being incident onto the substrate in the direction perpendicular thereto. The solution sample was filled in a solution cell of 1 cm square to measure the transmittance.

Example 1

Metal Oxide-Based Phosphor Microfine Particles: $Y_3Al_5O_{12}$:Ce (i) A glass inner tube previously filled with 52.8 mL of 1,4-butanediol as a dispersing medium (hereinafter referred to merely as "1,4-BD"; available from Kanto Kagaku Co., Ltd.; boiling point: 229° C.) was charged with 2.51 g of yttrium acetate tetrahydrate available from Kanto Kagaku Co., Ltd., 0.025 g of cerium acetate monohydrate available from Kanto Kagaku Co., Ltd., and 2.55 g of aluminum triisopropoxide (hereinafter referred to merely as "AIP") available from Kanto Kagaku Co., Ltd.

(ii) Into a clearance between the glass inner tube and the pressure container was added 10.8 mL of 1,4-BD. Meanwhile, an inner volume of the pressure container was 120 mL, the volume of the raw solution charged was 63.6 mL, and a charging volume ratio of the raw solution to the inner volume of the pressure container was 53.0%.

(iii) The raw solution thus charged was heated to 300° C. at a temperature rise rate of 3.1° C./min while stirring the solution using a stirrer at a rotating speed of 300 rpm.

(iv) Thereafter, the reaction solution was held at 300° C. for 2 h to allow the reaction to further proceed. As a result, it was confirmed that after 2 h, the reaction pressure reached 5.1 MPa.

(v) After cooling the reaction solution to room temperature, the obtained reaction product was subjected to centrifugal separation, and ethanol was added to the residual precipitate. After repeating the above procedure four times, the obtained product was dried by air blast at 50° C. to obtain particles.

These raw materials and the production conditions are shown in Table 1.

With respect to the thus obtained particles, the respective measurements were performed by the above methods (1) to (4). The results are shown below.

Figure 7:
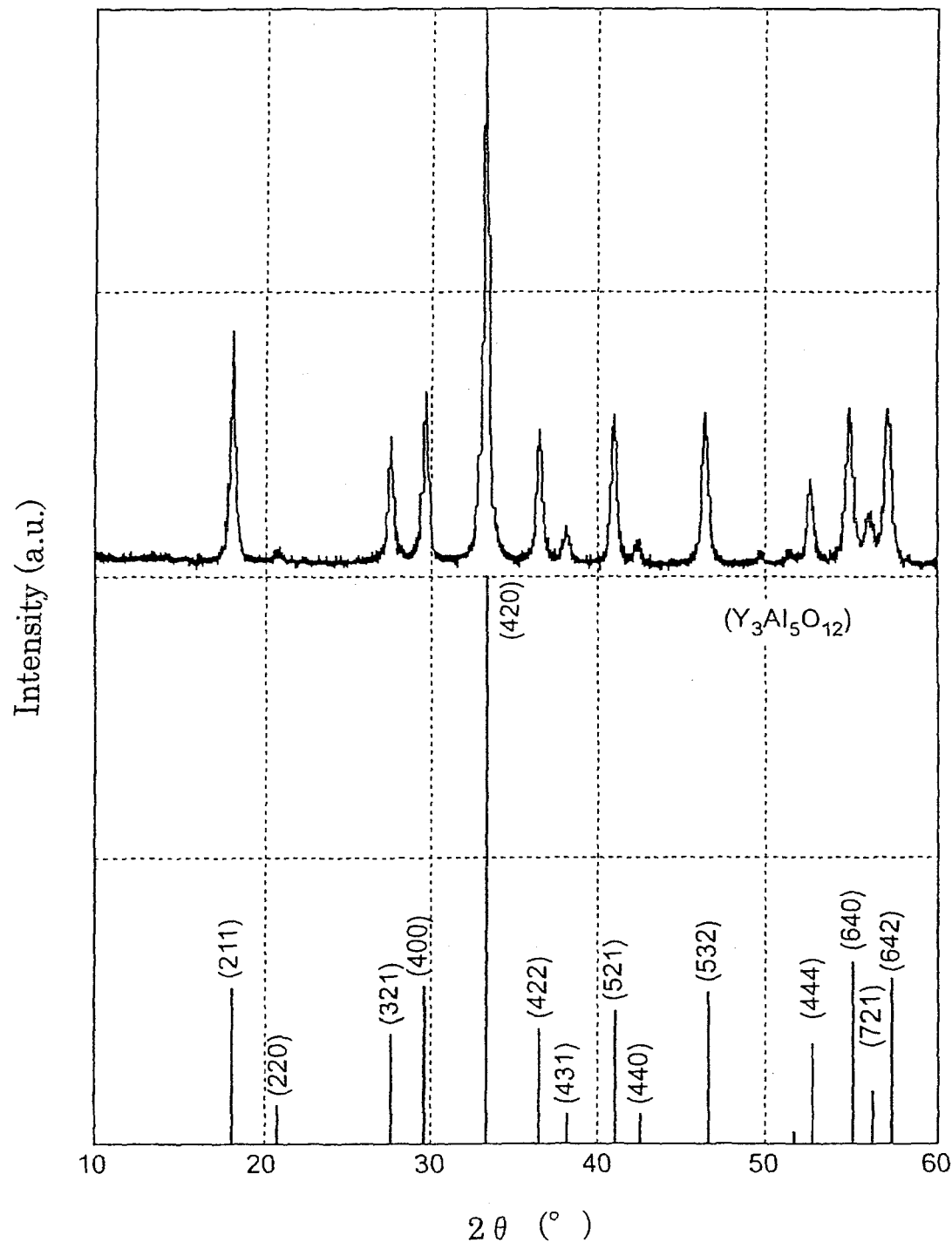
FIG. 7 is a view showing an X-ray diffraction pattern of particles obtained in Example 1 (upper portion) and a JCPDS card corresponding to $Y_3Al_5O_{12}$ (lower portion).

The thus obtained particles were identified by X-ray diffraction using the above method (1). In FIG. 7, there are shown the obtained X-ray diffraction pattern (upper portion), and JCPDS card corresponding to $Y_3Al_5O_{12}$ (lower portion). As apparently shown in FIG. 7, it was confirmed that all of peaks including the peak at (420) plane having a strongest diffraction intensity were consistent with those of JCPDS card corresponding to $Y_3Al_5O_{12}$, and a matrix crystal thereof was therefore composed of $Y_3Al_5O_{12}$.

The content (% by mass) of Ce in the particles was measured by the above method (2). As a result, it was confirmed that the content of Ce was 0.53% by mass and, therefore, Ce was doped into the particles.

The average particle size of the particles was measured by the above method (3). As a result, it was confirmed that the average particle size of the particles was 46 nm.

Figure 8:
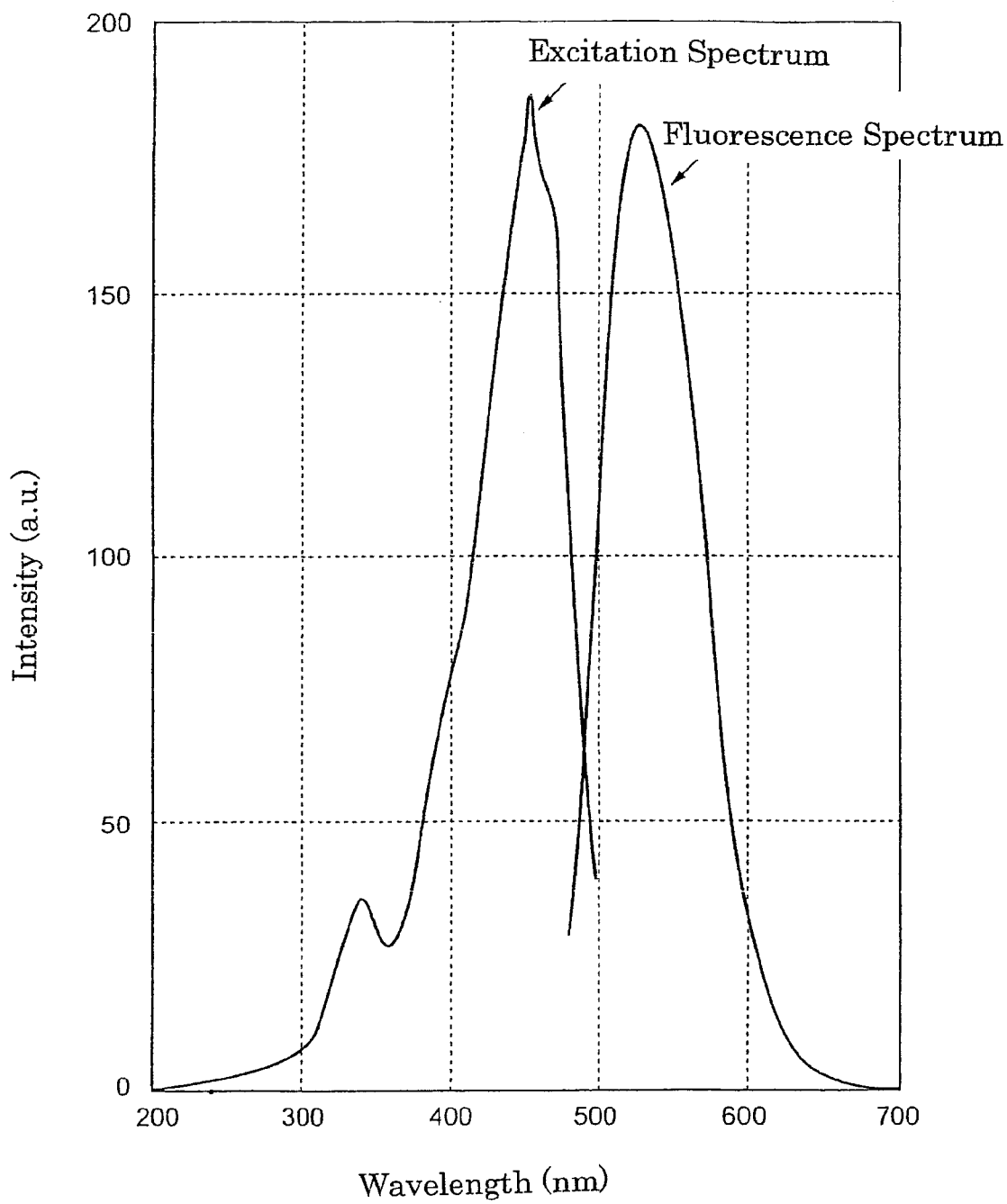
FIG. 8 is view showing an excitation spectrum and a fluorescence spectrum of particles obtained in Example 1.

The wavelengths $\lambda_{EX}$ and $\lambda_{EM}$ and the peak intensity I were measured by the above method (4). As a result, it was confirmed that the wavelengths $\lambda_{EX}$ and $\lambda_{EM}$ were 452 nm and 528 nm, respectively, and the peak intensity I was 25.9 (optional unit). In FIG. 8, there are shown an excitation spectrum and a fluorescence spectrum obtained from the measurement.

Example 2

Metal Oxide-Based Phosphor Microfine Particles: $Y_3Al_5O_{12}$:Ce (i) A glass inner tube previously filled with 52.8 mL of 1,4-BD as a dispersing medium was charged with 2.51 g of yttrium acetate tetrahydrate available from Kanto Kagaku Co., Ltd., 0.025 g of cerium acetate monohydrate available from Kanto Kagaku Co., Ltd., and 2.55 g of AIP available from Kanto Kagaku Co., Ltd.

(ii) Into a clearance between the glass inner tube and the pressure container was added 10.8 mL of 1,4-BD. Meanwhile, an inner volume of the pressure container was 120 mL, the volume of the raw solution charged was 63.6 mL, and a charging volume ratio of the raw solution to the inner volume of the pressure container was 53.0%.

(iii) The raw solution thus charged was heated to 300° C. at a temperature rise rate of 3.1° C./min while stirring the solution using a stirrer at a rotating speed of 300 rpm.

(iv) Thereafter, the reaction solution was held at 300° C. for 4 h to allow the reaction to further proceed. As a result, it was confirmed that after 4 h, the reaction pressure reached 5.5 MPa.

(v) After cooling the reaction solution to room temperature, the obtained reaction product was subjected to centrifugal separation, and ethanol was added to the residual precipitate. After repeating the above procedure four times, the obtained product was dried by air blast at 50° C. to obtain particles.

These raw materials and the production conditions are shown in Table 1.

With respect to the thus obtained particles, the respective measurements were performed by the above methods (1) to (4). The results are shown below.

The thus obtained particles were identified by X-ray diffraction using the above method (1). As a result, it was confirmed that all of peaks were consistent with those of JCPDS card corresponding to $Y_3Al_5O_{12}$, and a matrix crystal thereof was therefore composed of $Y_3Al_5O_{12}$.

The content (% by mass) of Ce in the particles was measured by the above method (2). As a result, it was confirmed that the content of Ce was 0.54% by mass and, therefore, Ce was doped into the particles.

The average particle size of the particles was measured by the above method (3). As a result, it was confirmed that the average particle size of the particles was 52 nm.

The wavelengths $\lambda_{EX}$ and $\lambda_{EM}$ and the peak intensity I were measured by the above method (4). As a result, it was confirmed that the wavelengths $\lambda_{EX}$ and $\lambda_{EM}$ were 453 nm and 528 nm, respectively, and the peak intensity I was 38.3 (optional unit).

Example 3

Metal Oxide-Based Phosphor Microfine Particles: $Y_3Al_5O_{12}$:Ce,Lu (i) A glass inner tube previously filled with 52.8 mL of 1,4-BD as a dispersing medium was charged with 2.26 g of yttrium acetate tetrahydrate available from Kanto Kagaku Co., Ltd., 0.13 g of lutetium acetate monohydrate available from Kanto Kagaku Co., Ltd., 0.025 g of cerium acetate monohydrate available from Kanto Kagaku Co., Ltd., and 2.55 g of AIP available from Kanto Kagaku Co., Ltd.

(ii) Into a clearance between the glass inner tube and the pressure container was added 10.8 mL of 1,4-BD. Meanwhile, an inner volume of the pressure container was 120 mL, the volume of the raw solution charged was 63.6 mL, and a charging volume ratio of the raw solution to the inner volume of the pressure container was 53.0%.

(iii) The raw solution thus charged was heated to 300° C. at a temperature rise rate of 3.1° C./min while stirring the solution using a stirrer at a rotating speed of 300 rpm.

(iv) Thereafter, the reaction solution was held at 300° C. for 2 h to allow the reaction to further proceed. As a result, it was confirmed that after 2 h, the reaction pressure reached 4.5 MPa.

(v) After cooling the reaction solution to room temperature, the obtained reaction product was subjected to centrifugal separation, and ethanol was added to the residual precipitate. After repeating the above procedure four times, the obtained product was dried by air blast at 50° C. to obtain particles.

These raw materials and the production conditions are shown in Table 1.

With respect to the thus obtained particles, the respective measurements were performed by the above methods (1) to (4). The results are shown below.

The thus obtained particles were identified by X-ray diffraction using the above method (1). As a result, it was confirmed that all of peaks were consistent with those of JCPDS card corresponding to $Y_3Al_5O_{12}$, and a matrix crystal thereof was therefore composed of $Y_3Al_5O_{12}$.

The contents (% by mass) of Ce and Lu in the particles were measured by the above method (2). As a result, it was confirmed that the content of Ce was 0.52% by mass, the content of Lu was 3.51% by mass and, therefore, Ce and Lu were doped into the particles.

The average particle size of the particles was measured by the above method (3). As a result, it was confirmed that the average particle size of the particles was 56 nm.

The wavelengths $\lambda_{EX}$ and $\lambda_{EM}$ and the peak intensity I were measured by the above method (4). As a result, it was confirmed that the wavelengths $\lambda_{EX}$ and $\lambda_{EM}$ were 452 nm and 526 nm, respectively, and the peak intensity I was 18.8 (optional unit).

Example 4

Metal Oxide-Based Phosphor Microfine Particles: $Y_3Al_5O_{12}$:Ce (i) A glass inner tube previously filled with 52.8 mL of 1,4-BD as a dispersing medium was charged with 2.51 g of yttrium acetate tetrahydrate available from Kanto Kagaku Co., Ltd., 0.025 g of cerium acetate monohydrate available from Kanto Kagaku Co., Ltd., and 3.07 g of aluminum tri-sec-butoxide (hereinafter referred to merely as "ASB") available from Kanto Kagaku Co., Ltd.

(ii) Into a clearance between the glass inner tube and the pressure container was added 10.8 mL of 1,4-BD. Meanwhile, an inner volume of the pressure container was 120 mL, the volume of the raw solution charged was 63.6 mL, and a charging volume ratio of the raw solution to the inner volume of the pressure container was 53.0%.

(iii) The raw solution thus charged was heated to 300° C. at a temperature rise rate of 3.1° C./min while stirring the solution using a stirrer at a rotating speed of 300 rpm.

(iv) Thereafter, the reaction solution was held at 300° C. for 2 h to allow the reaction to further proceed. As a result, it was confirmed that after 2 h, the reaction pressure reached 4.5 MPa.

(v) After cooling the reaction solution to room temperature, the obtained reaction product was subjected to centrifugal separation, and ethanol was added to the residual precipitate. After repeating the above procedure four times, the obtained product was dried by air blast at 50° C. to obtain particles.

These raw materials and the production conditions are shown in Table 1.

With respect to the thus obtained particles, the respective measurements were performed by the above methods (1) to (4). The results are shown below.

The thus obtained particles were identified by X-ray diffraction using the above method (1). As a result, it was confirmed that all of peaks were consistent with those of JCPDS card corresponding to $Y_3Al_5O_{12}$, and a matrix crystal thereof was therefore composed of $Y_3Al_5O_{12}$.

The content (% by mass) of Ce in the particles was measured by the above method (2). As a result, it was confirmed that the content of Ce was 0.46% by mass and, therefore, Ce was doped into the particles.

The average particle size of the particles was measured by the above method (3). As a result, it was confirmed that the average particle size of the particles was 82 nm.

The wavelengths $\lambda_{EX}$ and $\lambda_{EM}$ and the peak intensity I were measured by the above method (4). As a result, it was confirmed that the wavelengths $\lambda_{EX}$ and $\lambda_{EM}$ were 452 nm and 530 nm, respectively, and the peak intensity I was 15.8 (optional unit).

Example 5

Metal Oxide-Based Phosphor Microfine Particles: $Y_3Al_5O_{12}$:Ce (i) A glass inner tube previously filled with 52.8 mL of ethylene glycol (hereinafter referred to merely as "EG"; available from Kanto Kagaku Co., Ltd.; boiling point: 198° C.) as a dispersing medium was charged with 2.51 g of yttrium acetate tetrahydrate available from Kanto Kagaku Co., Ltd., 0.025 g of cerium acetate monohydrate available from Kanto Kagaku Co., Ltd., and 2.55 g of AIP available from Kanto Kagaku Co., Ltd.

(ii) Into a clearance between the glass inner tube and the pressure container was added 10.8 mL of EG. Meanwhile, an inner volume of the pressure container was 120 mL, the volume of the raw solution charged was 63.6 mL, and a charging volume ratio of the raw solution to the inner volume of the pressure container was 53.0%.

(iii) The raw solution thus charged was heated to 300° C. at a temperature rise rate of 3.1° C./min while stirring the solution using a stirrer at a rotating speed of 300 rpm.

(iv) Thereafter, the reaction solution was held at 300° C. for 2 h to allow the reaction to further proceed. As a result, it was confirmed that after 2 h, the reaction pressure reached 2.0 MPa.

(v) After cooling the reaction solution to room temperature, the obtained reaction product was subjected to centrifugal separation, and ethanol was added to the residual precipitate. After repeating the above procedure four times, the obtained product was dried by air blast at 50° C. to obtain particles.

These raw materials and the production conditions are shown in Table 1.

With respect to the thus obtained particles, the respective measurements were performed by the above methods (1) to (4). The results are shown below.

The thus obtained particles were identified by X-ray diffraction using the above method (1). As a result, it was confirmed that all of peaks were consistent with those of JCPDS card corresponding to $Y_3Al_5O_{12}$, and a matrix crystal thereof was therefore composed of $Y_3Al_5O_{12}$.

The content (% by mass) of Ce in the particles was measured by the above method (2). As a result, it was confirmed that the content of Ce was 0.52% by mass and, therefore, Ce was doped into the particles.

The average particle size of the particles was measured by the above method (3). As a result, it was confirmed that the average particle size of the particles was 51 nm.

The wavelengths $\lambda_{EX}$ and $\lambda_{EM}$ and the peak intensity I were measured by the above method (4). As a result, it was confirmed that the wavelengths $\lambda_{EX}$ and $\lambda_{EM}$ were 452 nm and 530 nm, respectively, and the peak intensity I was 15.8 (optional unit).

Example 6

Metal Oxide-Based Phosphor Microfine Particles: $Y_3Al_5O_{12}$:Ce (i) A glass inner tube previously filled with 26.4 mL of 1,4-BD and 26.4 mL of polyethylene glycol #200 (hereinafter referred to merely as "PEG"; available from Kanto Kagaku Co., Ltd.) as dispersing media was charged with 2.51 g of yttrium acetate tetrahydrate available from Kanto Kagaku Co., Ltd., 0.025 g of cerium acetate monohydrate available from Kanto Kagaku Co., Ltd., and 2.55 g of AIP available from Kanto Kagaku Co., Ltd.

(ii) Into a clearance between the glass inner tube and the pressure container was added 10.8 mL of a mixed solution containing 1,4-butanediol and polyethylene glycol #200 available from Kanto Kagaku Co., Ltd., at a volume ratio of 1:1. Meanwhile, an inner volume of the pressure container was 120 mL, the volume of the raw solution charged was 63.6 mL, and a charging volume ratio of the raw solution to the inner volume of the pressure container was 53.0%.

(iii) The raw solution thus charged was heated to 300° C. at a temperature rise rate of 3.1° C./min while stirring the solution using a stirrer at a rotating speed of 300 rpm.

(iv) Thereafter, the reaction solution was held at 300° C. for 4 h to allow the reaction to further proceed. As a result, it was confirmed that after 4 h, the reaction pressure reached 1.5 MPa.

(v) After cooling the reaction solution to room temperature, the obtained reaction product was subjected to centrifugal separation, and ethanol was added to the residual precipitate. After repeating the above procedure four times, the obtained product was dried by air blast at 50° C. to obtain particles.

These raw materials and the production conditions are shown in Table 1.

With respect to the thus obtained particles, the respective measurements were performed by the above methods (1) to (4). The results are shown below.

The thus obtained particles were identified by X-ray diffraction using the above method (1). As a result, it was confirmed that all of peaks were consistent with those of JCPDS card corresponding to $Y_3Al_5O_{12}$, and a matrix crystal thereof was therefore composed of $Y_3Al_5O_{12}$.

The content (% by mass) of Ce in the particles was measured by the above method (2). As a result, it was confirmed that the content of Ce was 0.48% by mass and, therefore, Ce was doped into the particles.

The average particle size of the particles was measured by the above method (3). As a result, it was confirmed that the average particle size of the particles was 52 nm.

The wavelengths $\lambda_{EX}$ and $\lambda_{EM}$ and the peak intensity I were measured by the above method (4). As a result, it was confirmed that the wavelengths $\lambda_{EX}$ and $\lambda_{EM}$ were 452 nm and 528 nm, respectively, and the peak intensity I was 48.1 (optional unit).

Example 7

Metal Oxide-Based Phosphor Microfine Particles: $Y_3Al_5O_{12}$:Ce (i) A glass inner tube previously filled with 66.0 mL of 1,4-BD as a dispersing medium was charged with 2.51 g of yttrium acetate tetrahydrate available from Kanto Kagaku Co., Ltd., 0.025 g of cerium acetate monohydrate available from Kanto Kagaku Co., Ltd., and 2.55 g of AIP available from Kanto Kagaku Co., Ltd.

(ii) Into a clearance between the glass inner tube and the pressure container was added 10.8 mL of 1,4-BD. Meanwhile, an inner volume of the pressure container was 120 mL, the volume of the raw solution charged was 76.8 mL, and a charging volume ratio of the raw solution to the inner volume of the pressure container was 64.0%.

(iii) The raw solution thus charged was heated to 300° C. at a temperature rise rate of 3.1° C./min while stirring the solution using a stirrer at a rotating speed of 300 rpm.

(iv) Thereafter, the reaction solution was held at 300° C. for 0.5 h to allow the reaction to further proceed. As a result, it was confirmed that after 0.5 h, the reaction pressure reached 1.4 MPa.

(v) After cooling the reaction solution to room temperature, the obtained reaction product was subjected to centrifugal separation, and ethanol was added to the residual precipitate. After repeating the above procedure four times, the obtained product was dried by air blast at 50° C. to obtain particles.

These raw materials and the production conditions are shown in Table 1.

With respect to the thus obtained particles, the respective measurements were performed by the above methods (1) to (4). The results are shown below.

The thus obtained particles were identified by X-ray diffraction using the above method (1). As a result, it was confirmed that all of peaks were consistent with those of JCPDS card corresponding to $Y_3Al_5O_{12}$, and a matrix crystal thereof was therefore composed of $Y_3Al_5O_{12}$.

The content (% by mass) of Ce in the particles was measured by the above method (2). As a result, it was confirmed that the content of Ce was 0.55% by mass and, therefore, Ce was doped into the particles.

The average particle size of the particles was measured by the above method (3). As a result, it was confirmed that the average particle size of the particles was 104 nm.

The wavelengths $\lambda_{EX}$ and $\lambda_{EM}$ and the peak intensity I were measured by the above method (4). As a result, it was confirmed that the wavelengths $\lambda_{EX}$ and $\lambda_{EM}$ were 452 nm and 526 nm, respectively, and the peak intensity I was 37.1 (optional unit).

B: Trimethylol propane triacrylate

C: Photopolymerization initiator (tradename: "IRGACURE 907" available from Ciba Specialty Chemical Corp.)

A:B:C (weight ratio)=55:42:3

(ii) The thus obtained dispersion was applied onto a glass substrate by a screen printing method to form a coating film thereon. The obtained coating film was dried at 150° C. for 20 min. Successively, the dried film was irradiated in air with light with an intensity of 300 mJ/cm$^3$ from a high-pressure mercury lamp, and then heat-treated in air at 200° C. for 60 min to obtain a fluorescent conversion film having a thickness of 10 μm.

Figure 9:
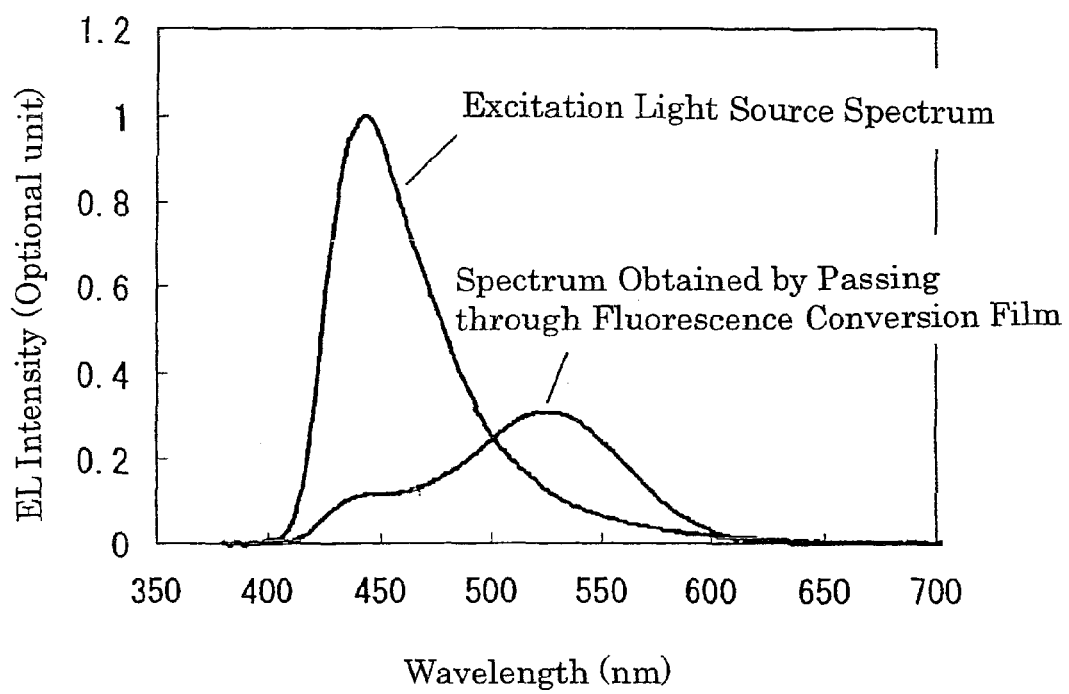
FIG. 9 is a view showing an emission spectrum of an organic EL device obtained in Example 6 and an emission spectrum of light transmitted through a fluorescent conversion film.

(iii) The thus obtained fluorescent conversion film was attached onto a light emission surface of an organic EL device capable of emitting a blue light (brightness: 100 nit; CIE chromaticity coordinates (0.16, 0.10); EL peak wavelength: 445 nm) through a silicone oil to measure an emission spectrum thereof. As a result, it was confirmed that a green light having CIE chromaticity coordinates of (0.22, 0.45) and a brightness of 139 nit was emitted. In FIG. 9, there are shown the emission spectrum of the organic EL device and the emission spectrum obtained by passing through the fluorescent conversion film.

TABLE 1-1

|  | Raw material of metal oxide in matrix crystal | Raw material of metal element as emission center | Dispersing medium (boiling point) |
| --- | --- | --- | --- |
| Example 1 | Yttrium acetate + AIP | Cerium acetate | 1,4-BD (229° C.) |
| Example 2 | Yttrium acetate + AIP | Cerium acetate | 1,4-BD (229° C.) |
| Example 3 | Yttrium acetate + AIP | Cerium acetate + lutetium acetate | 1,4-BD (229° C.) |
| Example 4 | Yttrium acetate + ASB | Cerium acetate | 1,4-BD (229° C.) |
| Example 5 | Yttrium acetate + AIP | Cerium acetate | EG (198° C.) |
| Example 6 | Yttrium acetate + AIP | Cerium acetate | 1,4-BD + PEG (229° C.) |
| Example 7 | Yttrium acetate + AIP | Cerium acetate | 1,4-BD (229° C.) |
| Comparative Example 1 | Yttrium acetate + AIP | Cerium acetate | PGMEA (146° C.) |

TABLE 1-2

|  | Reaction temperature (° C.) | Reaction time (h) | Pressure (MPa) |
| --- | --- | --- | --- |
| Example 1 | 300 | 2 | 5.1 |
| Example 2 | 300 | 4 | 5.5 |
| Example 3 | 300 | 2 | 4.5 |
| Example 4 | 300 | 2 | 4.5 |
| Example 5 | 300 | 2 | 2.0 |
| Example 6 | 300 | 2 | 1.5 |
| Example 7 | 300 | 0.5 | 1.4 |
| Comparative Example 1 | 265 | 2 | 1.5 |

Example 8

(i) To 1.0 g of the particles obtained in Example 1 were added 1.0 g of 1,4-BD and 4.0 g of 1-methoxy-2-acetoxypropane as dispersing media, and the obtained mixture was dispersed for 10 min while applying an ultrasonic wave thereto. Further, 1 g of a resin composition as a light-transmittable resin containing the following components (A) to (C) at a weight ratio shown below, and the resultant mixture was stirred to prepare a dispersion.

A: Methacrylic acid-methyl methacrylate copolymer (copolymerization ratio of methacrylic acid: 15%; weight-average molecular weight (Mw): 20000)

Comparative Example 1

(i) A glass inner tube previously filled with 52.8 mL of 1-methoxy-2-acetoxypropane (hereinafter referred to merely as "PGMEA"; available from Wako Junyaku Co., Ltd.; boiling point: 146° C.) as a dispersing medium containing no dissociating functional group at a terminal end or a side chain thereof was charged with 2.51 g of yttrium acetate tetrahydrate available from Kanto Kagaku Co., Ltd., 0.025 g of cerium acetate monohydrate available from Kanto Kagaku Co., Ltd., and 2.55 g of AIP available from Kanto Kagaku Co., Ltd.

(ii) Into a clearance between the glass inner tube and the pressure container was added 10.8 mL of PGMEA.

(iii) The raw solution thus charged was heated to 300° C. at a temperature rise rate of 3.1° C./min while stirring the solution using a stirrer at a rotating speed of 300 rpm.

(iv) Thereafter, the reaction solution was held at 265° C. for 2 h to allow the reaction to further proceed. As a result, it was confirmed that after 2 h, the reaction pressure reached 1.5 MPa.

(v) After cooling the reaction solution to room temperature, the obtained reaction product was subjected to centrifugal separation, and ethanol was added to the residual precipitate.

After repeating the above procedure four times, the obtained product was dried by air blast at 50° C. to obtain particles.

These raw materials and the production conditions are shown in Table 1.

Figure 10:
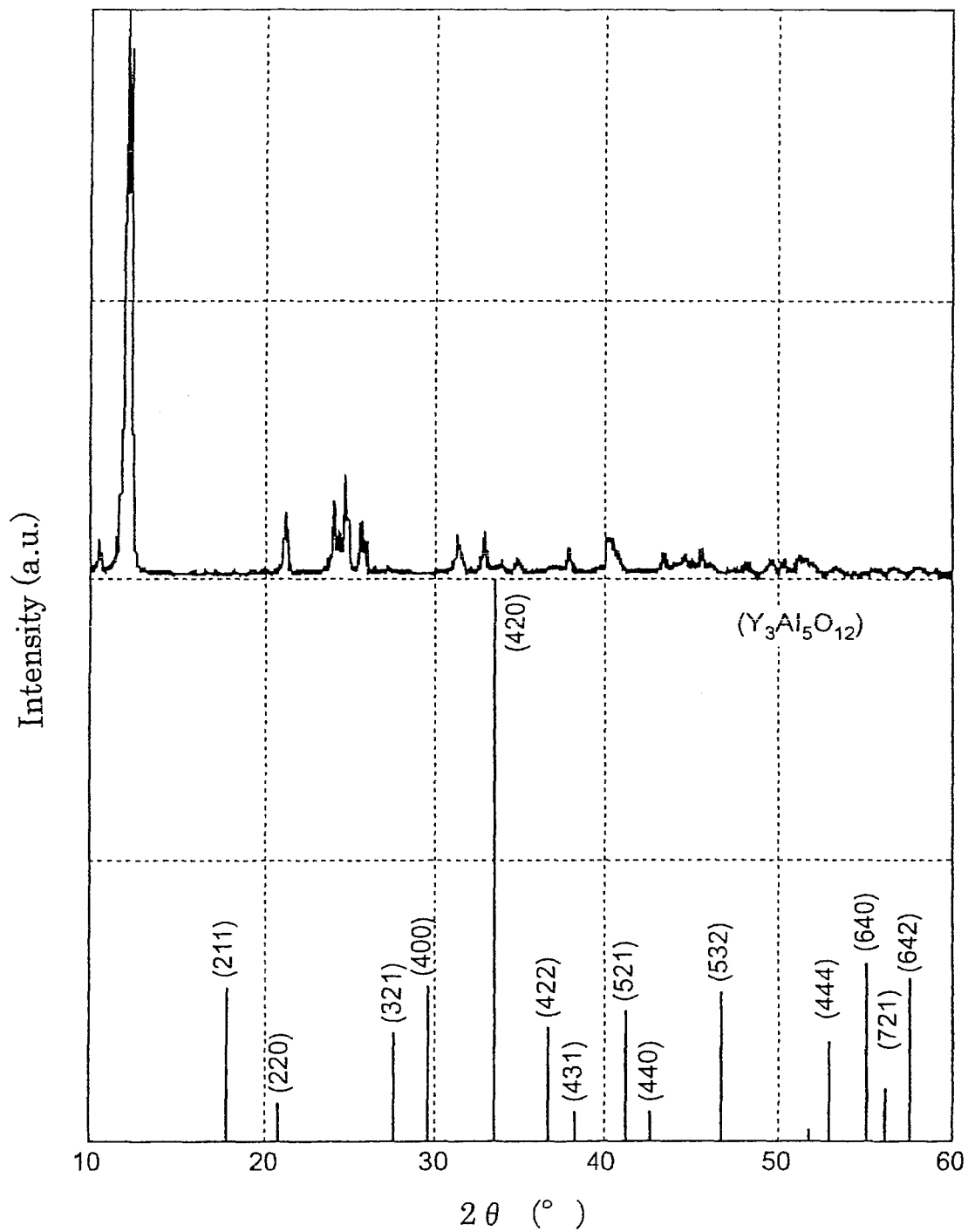
FIG. 10 is a view showing an X-ray diffraction pattern of particles obtained in Comparative Example 1 (upper portion) and a JCPDS card corresponding to $Y_3Al_5O_{12}$ (lower portion).

The thus obtained particles were identified by X-ray diffraction using the above method (1). In FIG. 10, there are shown the obtained X-ray diffraction pattern as well as JCPDS card corresponding to $Y_3Al_5O_{12}$. As apparently shown in FIG. 10, it was confirmed that the X-ray diffraction pattern was not consistent at all with that of JCPDS card corresponding to $Y_3Al_5O_{12}$. Therefore, it was impossible to identify the reaction product.

Further, the wavelengths $\lambda_{EX}$ and $\lambda_{EM}$ and the peak intensity I were measured by the above method (4). However, no effective fluorescence was detected.

Example 9

The steps (i) to (iv) were repeated in the same manner as in Example 1.

(v) After the reaction solution was cooled to room temperature and then allowed to stand for two weeks under the same condition, a supernatant liquid was separated from the solution and subjected to centrifugal separation under a centrifugal force of 2000 g using a centrifugal separator (high-speed cooling centrifuge "hinmac CR22" available from Hitachi Limited) for 60 min to thereby separate a precipitate therefrom. A small amount of the thus separated precipitate was sampled to measure an average particle size thereof by the above method (3). As a result, it was confirmed that the precipitated particles had an average particle size of 55 nm.

(vi) From the vicinity of a solid-liquid interface between the precipitate and the solvent, 1.0 g of a transparent dispersion was recovered. This procedure was repeated plural times. The thus collected transparent dispersion was placed in a quartz cell to measure a fluorescence therefrom by the method (4). As a result, it was confirmed that a peak wavelength of the fluorescence emitted was 520 nm. Further, when measuring an absorption spectrum of the transparent dispersion by the method (5), it was confirmed that the transmittance thereof as measured at a wavelength of 520 nm was 88%. The transparent dispersion was heated to 300° C. to measure a weight reduction thereof. From the measurement, it was confirmed that the amount of the solvent contained in the dispersion was 85% by weight, namely the solid content in the dispersion was 15%.

(vii) The phosphor obtained from the precipitate was in the form of a yellow transparent paste. The paste was heated to 300° C. in a nitrogen atmosphere to measure a weight reduction thereof. From the measurement, it was confirmed that the amount of the solvent contained in the paste was about 20% by weight, namely the solid content in the paste was 80%. After the heating, the phosphor was formed into a transparent mass.

Figure 11:
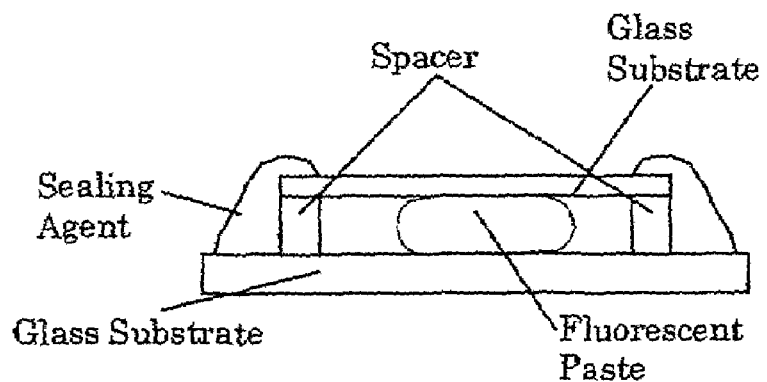
FIG. 11 is a schematic view showing a thin film-shaped sample obtained in Example 9.
Figure 12:
FIG. 12 is a photograph of the thin film-shaped sample obtained in Example 9 when viewed from above.
Figure 13:
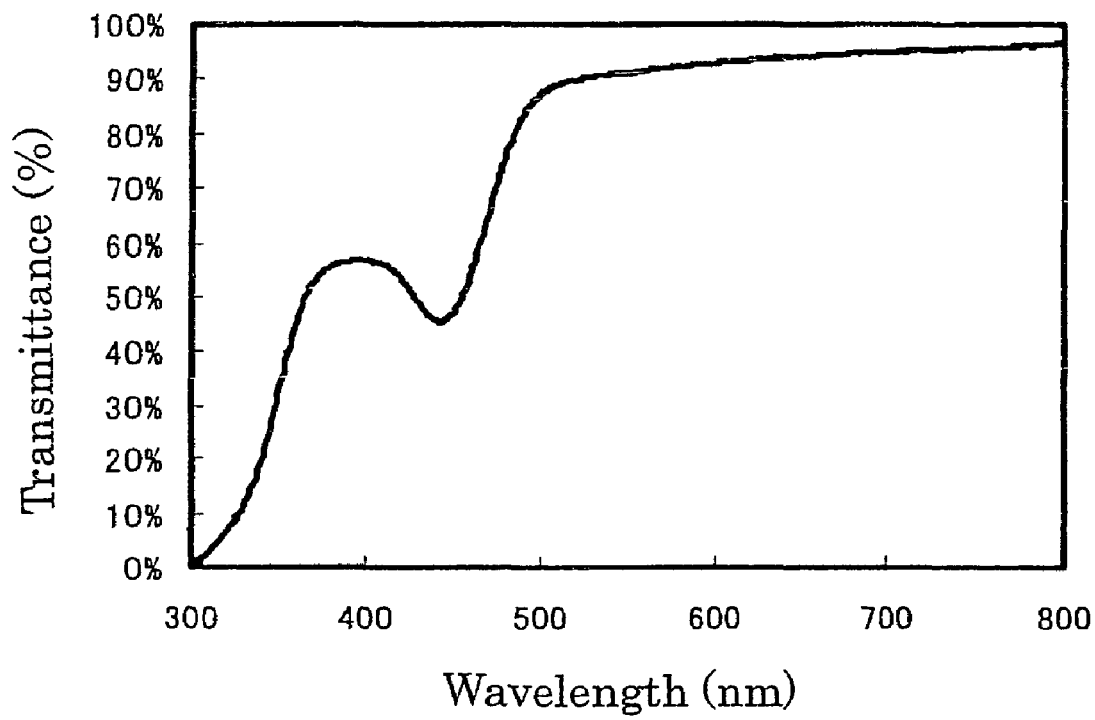
FIG. 13 is a view showing a transmission spectrum of a paste obtained in Example 9.
Figure 14:
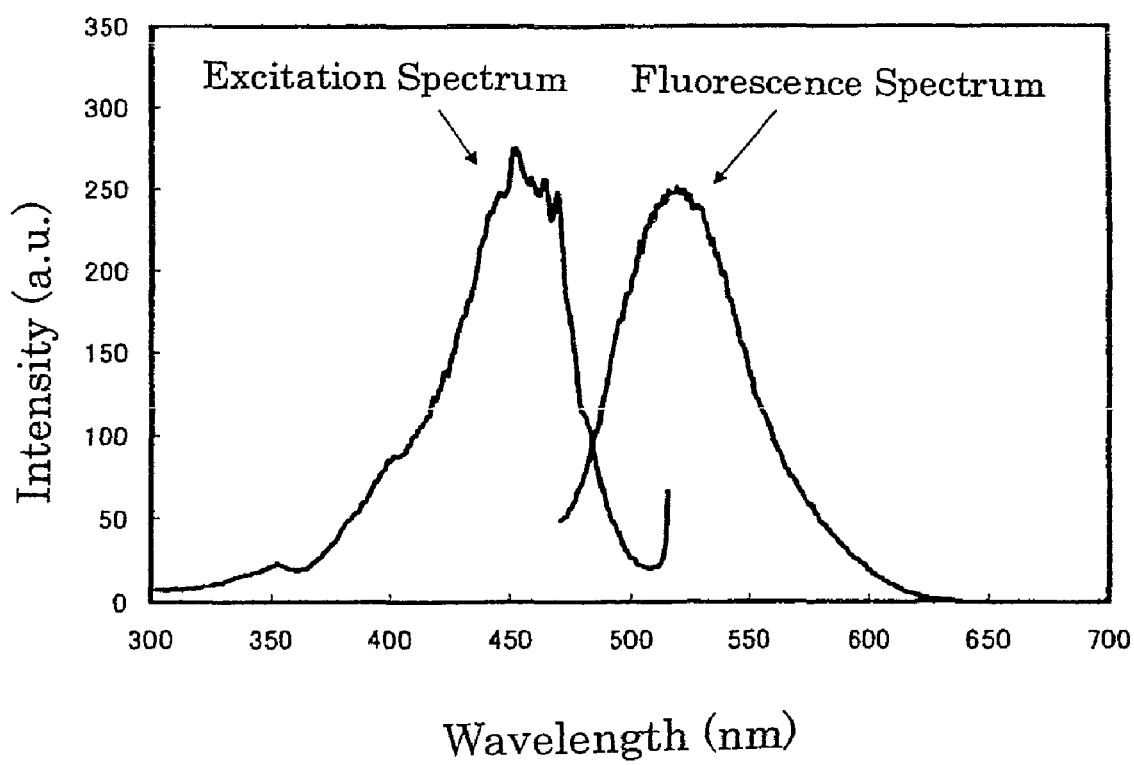
FIG. 14 is a view showing an excitation spectrum and a fluorescence spectrum of the paste obtained in Example 9.

(viii) Two glass substrates were disposed through spacers to form a clearance of 150 µm therebetween. The above paste was interposed in the clearance between the glass substrates and sealed by a sealing agent made of an epoxy adhesive, thereby obtaining a transparent thin film sample. A schematic view of the thus formed thin film sample and a photograph thereof as viewed from above are shown in FIGS. 11 and 12, respectively. In addition, a transmission spectrum obtained from the thin film sample is shown in FIG. 13, and a fluorescence spectrum and an excitation spectrum thereof are shown in FIG. 14. As a result, it was confirmed that a peak wavelength of the fluorescence spectrum was 520 nm. Also, when the absorption spectrum was measured by the method (5), it was confirmed that the transmittance of the thin film sample as measured at a wavelength of 520 nm was 89%. As is apparent from the photograph shown in FIG. 12, characters were clearly recognized through the thin film of the paste, and it was therefore confirmed that the thin film had a high transparency.

Comparative Example 2

The particles obtained in Example 1 and polyethylene glycol (molecular weight: 600) were mixed with each other at a weight ratio of 75:25, thereby producing a yellowish white turbid paste. Two glass substrates were disposed through spacers to form a clearance of 150 µm therebetween. The above paste was interposed in the clearance between the glass substrates and sealed by a sealing agent, thereby obtaining a transparent thin film sample. When measuring the thus obtained thin film sample by the method (4), it was confirmed that a peak wavelength in the fluorescence spectrum thereof was 525 nm. Also, when the absorption spectrum was measured by the method (5), it was confirmed that the transmittance of the thin film sample as measured at a wavelength of 525 nm was 45%.

Example 10

The steps (i) to (iv) were repeated in the same manner as in Example 1.

(v) The reaction solution was cooled to room temperature, and then filtered through a membrane filter of a cellulose-mixed ester type (available from Advantec Toyo Co., Ltd.; 1.0 µm mesh; 293 mmφ). Further, the obtained filtrate was subjected to centrifugal separation under a centrifugal force of 2000 g using a centrifugal separator for 60 min to thereby separate a precipitate therefrom. A small amount of the thus separated precipitate was sampled to measure an average particle size thereof by the above method (3). As a result, it was confirmed that the precipitated particles had an average particle size of 105 nm.

(vi) The phosphor obtained from the precipitate was in the form of a yellow transparent paste. The paste was heated to 300° C. in a nitrogen atmosphere to measure a weight reduction thereof. From the measurement, it was confirmed that the amount of the solvent contained in the paste was about 30% by weight, namely the solid content in the paste was 70% by weight. After the heating, the phosphor was reduced in volume and formed into a transparent mass. The solvent was removed from the paste to obtain a transparent solid.

(vii) Two glass substrates were disposed through spacers to form a clearance of 150 µm therebetween. The above paste was interposed in the clearance between the glass substrates and sealed by a sealing agent, thereby obtaining a transparent thin film sample. When the sample was irradiated with an ultraviolet light having a wavelength of 365 nm, it was confirmed that a green light was emitted therefrom, and the sample was therefore a phosphor.

Example 11

The steps (i) to (iv) were repeated in the same manner as in Example 1.

(v) The reaction solution was cooled to room temperature, and then subjected to centrifugal separation under a centrifugal force of 500 g using a centrifugal separator for 30 min to remove a precipitate therefrom and further to centrifugal separation under a centrifugal force of 2000 g using a centrifugal separator for 60 min to thereby separate a precipitate therefrom. A small amount of the thus separated precipitate was sampled to measure an average particle size thereof by the above method (3). As a result, it was confirmed that the precipitated particles had an average particle size of 65 nm.

(vi) The phosphor obtained from the precipitate was in the form of a yellow transparent paste. The paste was heated to 300° C. in a nitrogen atmosphere to measure a weight reduction thereof. From the measurement, it was confirmed that the amount of the solvent contained in the paste was about 25% by weight, namely the solid content in the paste was 75% by weight. After the heating, the phosphor was reduced in volume and formed into a transparent mass. The solvent was removed from the paste to obtain a transparent solid.

(vii) Two glass substrates were disposed through spacers to form a clearance of 150 μm therebetween. The above paste was interposed in the clearance between the glass substrates and sealed by a sealing agent, thereby obtaining a transparent thin film sample. When the sample was irradiated with an ultraviolet light having a wavelength of 365 nm, it was confirmed that a green light was emitted therefrom, and the sample was therefore a phosphor.

Example 12

The steps (i) to (iv) were repeated in the same manner as in Example 1.

(v) After cooling the reaction solution to room temperature, about 80 cc of the thus obtained product was mixed with the same volume of methanol, and the resultant mixture was intimately stirred. Further, the mixture was subjected to centrifugal separation under a centrifugal force of 2000 g using a centrifugal separator for 60 min to thereby separate a precipitate therefrom. A small amount of the thus separated precipitate was sampled to measure an average particle size thereof by the above method (3). As a result, it was confirmed that the precipitated particles had an average particle size of 45 nm. The precipitate was allowed to stand at 50° C. for one day under a nitrogen flow to remove methanol therefrom.

(vi) The phosphor obtained from the precipitate was in the form of a yellow transparent paste. The paste was heated to 300° C. in a nitrogen atmosphere to measure a weight reduction thereof. From the measurement, it was confirmed that the amount of the solvent contained in the paste was about 45% by weight, namely the solid content in the paste was 55% by weight. After the heating, the phosphor was reduced in volume and formed into a transparent mass. The solvent was removed from the paste to obtain a transparent solid.

(vii) Two glass substrates were disposed through spacers to form a clearance of 150 μm therebetween. The above paste was interposed in the clearance between the glass substrates and sealed by a sealing agent, thereby obtaining a transparent thin film sample. When the sample was irradiated with an ultraviolet light having a wavelength of 365 nm, it was confirmed that a green light was emitted therefrom, and the sample was therefore a phosphor.

Example 13

The steps (i) to (iv) were repeated in the same manner as in Example 1.

(v) After cooling the reaction solution to room temperature, about 80 cc of the thus obtained product was mixed with the same volume of acetone, and the resultant mixture was intimately stirred. Further, the mixture was subjected to centrifugal separation under a centrifugal force of 2000 g using a centrifugal separator for 60 min to thereby separate a precipitate therefrom. A small amount of the thus separated precipitate was sampled to measure an average particle size thereof by the above method (3). As a result, it was confirmed that the precipitated particles had an average particle size of 45 nm. The precipitate was allowed to stand at 50° C. for one day under a nitrogen flow to remove acetone therefrom.

(vi) The phosphor obtained from the precipitate was in the form of a yellow transparent paste. The paste was heated to 300° C. in a nitrogen atmosphere to measure a weight reduction thereof. From the measurement, it was confirmed that the amount of the solvent contained in the paste was about 45% by weight, namely the solid content in the paste was 55% by weight. After the heating, the phosphor was reduced in volume and formed into a transparent mass. The solvent was removed from the paste to obtain a transparent solid.

(vii) Two glass substrates were disposed through spacers to form a clearance of 150 μm therebetween. The above paste was interposed in the clearance between the glass substrates and sealed by a sealing agent, thereby obtaining a transparent thin film sample. When the sample was irradiated with an ultraviolet light having a wavelength of 365 nm, it was confirmed that a green light was emitted therefrom, and the sample was therefore a phosphor.

Example 14

The yellow transparent paste obtained in Example 12 was heated to 300° C. in an oven purged with nitrogen and held at that temperature for 30 min. The heated product was cooled and then taken out of the oven, thereby obtaining a transparent solid. When the thus obtained transparent solid was irradiated with an ultraviolet light having a wavelength of 365 nm, it was confirmed that a green light was emitted therefrom, and the transparent solid was therefore a fluorescent converter.

Example 15

The yellow transparent paste obtained in Example 12 and PEG (average molecular weight: 2000) were weighted and sampled in a beaker at a weight ratio of 1:1, and mixed with each other at about 150° C. on a hot plate. The resultant mixture was applied and spread over a glass substrate to obtain a yellow thin film. Also, the same mixture kept in a heated state was cast into a heat-resistant stainless steel box to obtain a resin substrate having a thickness of 2 mm. When the thin film and the resin substrate were irradiated with an ultraviolet light having a wavelength of 365 nm, it was confirmed that a green light was emitted from both thereof, and the thin film and the resin substrate were therefore fluorescent converters.

Example 16

In the step (viii) of Example 9, when the yellow transparent paste obtained therein was interposed between the two glass substrates, the clearance (film thickness of the paste) formed therebetween was varied as being 100 μm, 200 μm and 300 μm, respectively, to measure a peak intensity-dependency of a fluorescence spectrum obtained therefrom.

Figure 15:
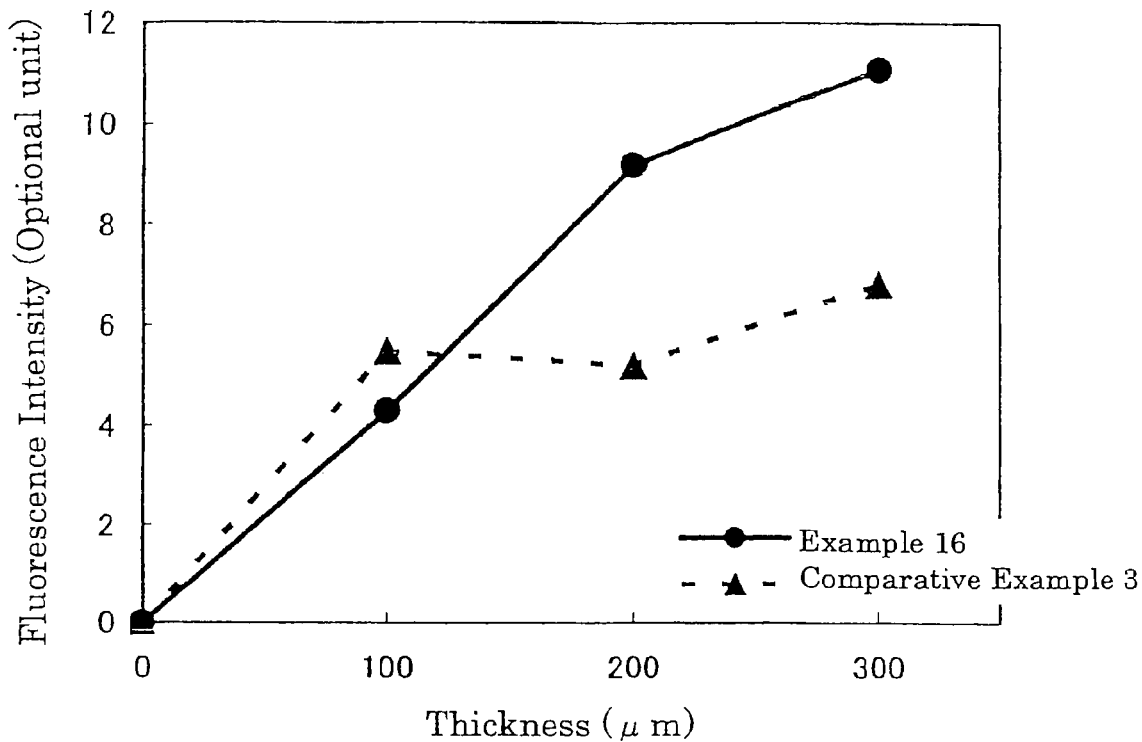
FIG. 15 is a view showing the relationship between a film thickness and a fluorescence intensity with respect to pastes obtained in Example 16 and Comparative Example 3.
Figure 16:
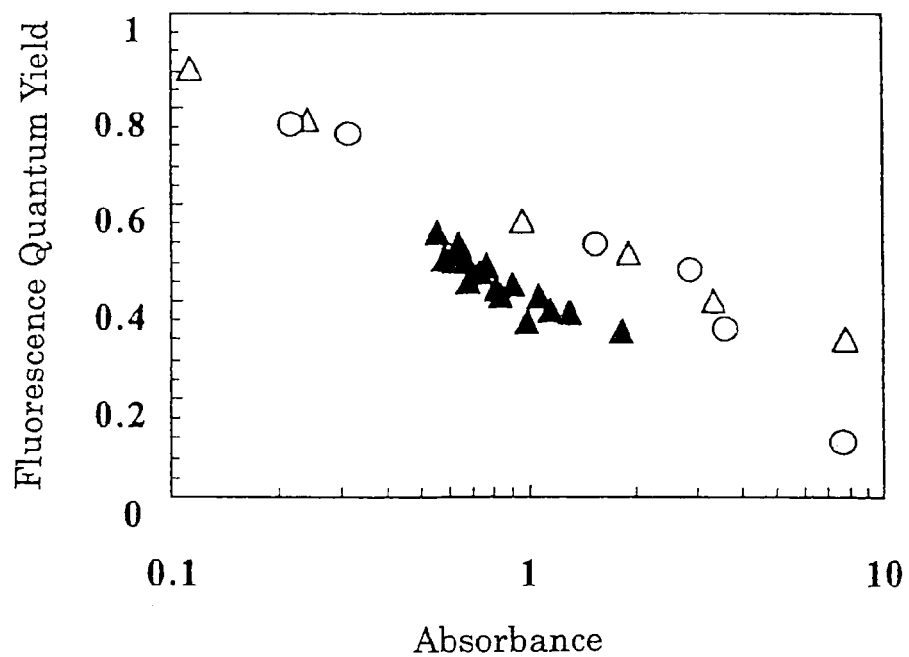
FIG. 16 is a view showing the relationship between an absorbance and a fluorescence quantum yield when varying a concentration of pigment contained in the conventional fluorescent conversion film.

The film thickness was plotted on an abscissa axis whereas the peak intensity as fluorescent intensity was plotted on an ordinate axis. The result of the plotting is shown in FIG. 15. As shown in FIG. 15, the film thickness and the fluorescence intensity exhibited a substantially proportional relation to each other, and it was confirmed that the fluorescence was emitted therefrom at a high efficiency owing to a good transparency of the paste.

Comparative Example 3

In Comparative Example 2, when the yellow transparent paste obtained therein was interposed between the two glass substrates, the clearance (film thickness of the paste) formed therebetween was varied as being 100 μm, 200 μm and 300 μm, respectively, to measure a peak intensity-dependency of a fluorescence spectrum obtained therefrom.

The film thickness was plotted on an abscissa axis whereas the peak intensity as fluorescent intensity was plotted on an ordinate axis. The result of the plotting is shown in FIG. 15. As shown in FIG. 15, the film thickness and the fluorescence intensity exhibited a less dependency relation to each other, and it was confirmed that the fluorescence was emitted therefrom only at a poor efficiency owing to an opaqueness of the paste even when increasing a thickness thereof.

Example 17

The yellow transparent paste obtained in Example 9 and polyethylene glycol (molecular weight: 6000) were mixed with each other at a weight ratio of 75:25 while heating to 150° C. The resultant mixture was cast into a stainless steel vat and cooled to room temperature to obtain a substrate having a thickness of 2 mm. When the substrate was irradiated with an ultraviolet light having a wavelength of 365 nm, it was confirmed that a green light was emitted therefrom, and the substrate was therefore a fluorescent conversion plate acting as a fluorescent converter.

Example 18

The yellow transparent paste obtained in Example 9 and polyethylene glycol (molecular weight: 6000) were mixed with each other at a weight ratio of 75:25 while heating to 150° C. A part of a resin of a blue light-emitting diode "NSPE520S" available from Nichia Kagaku Co., Ltd., was carefully removed therefrom, and the above mixture was dropped on an exposed light emission portion of the blue light-emitting diode, and then cooled. As a result, it was confirmed that a yellow to greenish white light was emitted from the light-emitting diode when it was turned on.

Example 19

The same procedures as in the steps (i) to (iii) of Example 8 were repeated except that the particles used in the step (i) of Example 8 was replaced with the yellow transparent paste obtained in Example 9, to measure an emission spectrum when emitting excited light from the same light source as used in the step (iii). As a result, it was confirmed that the CIE chromaticity coordinates were (0.25, 0.44), and a green light having a brightness of 130 nit was emitted.

INDUSTRIAL APPLICABILITY

As described above, the metal oxide-based phosphor microfine particles of the present invention have a small particle size as well as a high affinity to and a high dispersibility in light-transmittable resins, and are excellent in water resistance, chemical resistance and heat resistance. Therefore, a fluorescent conversion film, a fluorescent liquid, a fluorescent paste, a phosphor and a fluorescent converter using the metal oxide-based phosphor microfine particles are inhibited from scattering light emitted from a light source, and are extremely practical and useful for converting an excited light emitted from the light source into light having a longer wavelength when disposed on the light source. The light source includes, for example, organic electroluminescent devices, inorganic electroluminescent devices, light-emitting diodes, cold cathode tubes, fluorescent tubes and lasers.

The invention claimed is:

1. A dispersion of metal oxide-based phosphor microfine particles comprising:
    (a) a dispersing medium containing an organic compound having one or more functional groups bonded to a terminal end or a side chain thereof;
    (b) the metal oxide-based phosphor microfine particles comprising a matrix crystal made of a metal oxide and a metal element doped as an emission center into the matrix crystal; and
    (c) a resin component;
    wherein said microfine particles are provided with an organic group coordinated to a surface thereof which is formed by dissociating at least one of the functional groups from the organic compound.

2. The dispersion of metal oxide-based phosphor microfine particles according to claim 1, wherein said functional groups are OH groups.

3. The dispersion of metal oxide-based phosphor microfine particles according to claim 1, wherein said resin component is a light-transmittable resin.

* * * * *